United States Patent
Chen et al.

(10) Patent No.: US 11,521,933 B2
(45) Date of Patent: Dec. 6, 2022

(54) CURRENT FLOW BETWEEN A PLURALITY OF SEMICONDUCTOR CHIPS

(71) Applicant: FUJI ELECTRIC CO., LTD., Kanagawa (JP)

(72) Inventors: Shuangching Chen, Matsumoto (JP); Sayaka Yamamoto, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 277 days.

(21) Appl. No.: 16/835,238

(22) Filed: Mar. 30, 2020

(65) Prior Publication Data

US 2020/0227345 A1 Jul. 16, 2020

Related U.S. Application Data

(63) Continuation of application No. PCT/JP2019/009094, filed on Mar. 7, 2019.

(30) Foreign Application Priority Data

Apr. 18, 2018 (JP) .............................. JP2018-079907
Aug. 1, 2018 (JP) .............................. JP2018-145046

(51) Int. Cl.
*H01L 23/495* (2006.01)
*H01L 23/48* (2006.01)
(Continued)

(52) U.S. Cl.
CPC .... *H01L 23/5386* (2013.01); *H01L 23/49534* (2013.01); *H01L 23/49541* (2013.01);
(Continued)

(58) Field of Classification Search
CPC ............. H01L 29/1095; H01L 29/7395; H01L 29/8083; H01L 29/7393; H01L 23/495;
(Continued)

(56) References Cited

U.S. PATENT DOCUMENTS 10,002,858 B2 * 6/2018 Masuda ................ H01L 25/072
2014/0218991 A1 8/2014 Chen
(Continued)

FOREIGN PATENT DOCUMENTS

EP 3203625 A1 8/2017
JP H07249735 A 9/1995
(Continued)

OTHER PUBLICATIONS

International Search Report and (ISA/237) Written Opinion of the International Search Authority for International Patent Application No. PCT/JP2019/009094, mailed by the Japan Patent Office dated Apr. 9, 2019.

*Primary Examiner* — Alonzo Chambliss

(57) ABSTRACT

A semiconductor device is provided, which includes a semiconductor chip; a first current input/output portion that is electrically connected to the semiconductor chip; a second current input/output portion that is electrically connected to the semiconductor chip; three or more conducting portions provided with the semiconductor chip, between the first current input/output portion and the second current input/output portion; and a current path portion having a path through which current is conducted to each of the three or more conducting portions, wherein the current path portion includes a plurality of slits.

29 Claims, 29 Drawing Sheets

(51) Int. Cl.
  *H01L 21/00* (2006.01)
  *H01R 9/00* (2006.01)
  *H05K 7/18* (2006.01)
  *H01L 23/538* (2006.01)
  *H02M 7/483* (2007.01)
  *H01L 23/00* (2006.01)
  *H01L 23/498* (2006.01)
  *H01L 29/739* (2006.01)
  *H01L 29/10* (2006.01)
  *H01L 29/808* (2006.01)

(52) U.S. Cl.
  CPC .. *H01L 23/49562* (2013.01); *H01L 23/49575* (2013.01); *H01L 23/49833* (2013.01); *H01L 23/49838* (2013.01); *H01L 24/06* (2013.01); *H01L 24/48* (2013.01); *H01L 24/49* (2013.01); *H01L 24/97* (2013.01); *H01L 29/1095* (2013.01); *H01L 29/7393* (2013.01); *H01L 29/7395* (2013.01); *H01L 29/8083* (2013.01); *H02M 7/483* (2013.01)

(58) Field of Classification Search
  CPC ......... H01L 23/49562; H01L 23/49534; H01L 23/49575; H01L 23/49838; H01L 23/49833; H01L 23/49541; H01L 24/48; H01L 24/49; H01L 24/06; H01L 24/97
  See application file for complete search history.

(56) References Cited

U.S. PATENT DOCUMENTS

| 2016/0358895 A1 | 12/2016 | Nakashima |
| 2017/0170157 A1 | 6/2017 | Masuda |

FOREIGN PATENT DOCUMENTS

| JP | 2001094035 A | 4/2001 |
| JP | 2002153079 A | 5/2002 |
| JP | 2002353407 A | 12/2002 |
| JP | 2008091809 A | 4/2008 |
| JP | 2009296727 A | 12/2009 |
| JP | 2010087400 A | 4/2010 |
| JP | 2012095472 A | 5/2012 |
| JP | 2013062551 A | 4/2013 |
| JP | 2014016925 A | 1/2014 |
| JP | 2014155287 A | 8/2014 |
| JP | 2015153839 A | 8/2015 |
| JP | 2016009496 A | 1/2016 |
| JP | 2017139915 A | 8/2017 |
| WO | 2014016925 A1 | 1/2014 |
| WO | 2014192118 A1 | 12/2014 |
| WO | 2015121900 A1 | 8/2015 |
| WO | 2016009496 A1 | 1/2016 |

\* cited by examiner

CURRENT FLOW BETWEEN A PLURALITY OF SEMICONDUCTOR CHIPS

The contents of the following Japanese patent application(s) are incorporated herein by reference:
NO. 2018-079907 filed in JP on Apr. 18, 2018,
NO. 2018-145046 filed in JP on Aug. 1, 2018, and
PCT/JP2019/009094 filed on Mar. 7, 2019.

BACKGROUND

1. Technical Field

The present invention relates to a semiconductor device.

2. Related Art

A conventional semiconductor device is known that includes a plurality of semiconductor chips, in which a current flows through each of the plurality of semiconductor chips, as shown in Patent Document 1, for example.

Patent Document 1: Japanese Unexamined Patent Application Publication No. 2016-9496
Patent Document 2: Japanese Patent Application Publication No. 2002-153079

In the semiconductor device, it is preferable to eliminate imbalances among the currents flowing through the respective semiconductor chips.

GENERAL DISCLOSURE

According to a first aspect of the present invention, provided is a semiconductor device comprising a semiconductor chip; a first current input/output portion that is electrically connected to the semiconductor chip; a second current input/output portion that is electrically connected to the semiconductor chip; three or more conducting portions provided with the semiconductor chip, between the first current input/output portion and the second current input/output portion; and a current path portion having a path through which current is conducted to each of the three or more conducting portions, wherein the current path portion includes a plurality of slits.

The conducting portions may be the semiconductor chip.

The semiconductor device may further comprise an insulating substrate provided with the semiconductor chip. The current path portion may be a conductive pattern provided on the insulating substrate.

The semiconductor device may further comprise a lead frame that is electrically connected to the semiconductor chip. The current path portion may be the lead frame.

The semiconductor device may further comprise an insulating substrate provided with the semiconductor chip. The conducting portions may be the insulating substrate.

The semiconductor device may further comprise a terminal bar for electrically connecting the semiconductor chip and an external terminal. The current path portion may be the terminal bar.

The first current input/output portion may be a current input portion. The second current input/output portion may be a current output portion. The three or more conducting portions may include a first conducting portion, a second conducting portion, and a third conducting portion that are arranged in order. The plurality of slits may include a first slit and a second slit. An end portion of the first slit may be provided between the current output portion and the first conducting portion. An end portion of the second slit may be provided between the first conducting portion and the second conducting portion.

The three or more conducting portions may include a first conducting portion, a second conducting portion, and a third conducting portion that are arranged in order. The plurality of slits may include a first slit and a second slit. An end portion of the first slit may be provided between the first conducting portion and the second conducting portion. An end portion of the second slit may be provided between the second conducting portion and the third conducting portion.

The plurality of slits may include an L-shaped slit and an F-shaped slit.

The plurality of slits may include an L-shaped slit and an I-shaped slit.

The first current input/output portion may be a current input portion. The second current input/output portion may be a current output portion. The plurality of slits may be provided on the current input portion side of the conducting portions.

The first current input/output portion may be a current input portion. The second current input/output portion may be a current output portion. The plurality of slits may be provided on the current output portion side of the conducting portions.

The plurality of slits may be formed in a pattern.

The semiconductor device may comprise an insulating vibration absorbing member in the plurality of slits.

The three or more conducting portions may each include a first transistor that has a collector terminal connected to a P terminal; a second transistor that has an emitter terminal connected to an N terminal, and is connected in series with the first transistor; and a third transistor and a fourth transistor forming a bidirectional switch. A connection point between an emitter terminal of the first transistor and a collector terminal of the second transistor may be connected to a U terminal. The bidirectional switch may have one end connected to the connection point and the other end connected to an M terminal.

The three or more conducting portions may each include a first transistor that has a collector terminal connected to a P terminal; a second transistor that has an emitter terminal connected to an N terminal; a third transistor that is connected in series with the first transistor; a fourth transistor that is connected in series with the third transistor and the second transistor; and two diodes that are provided in series between a collector terminal of the third transistor and an emitter terminal of the fourth transistor. A connection point between an emitter terminal of the third transistor and a collector terminal of the fourth transistor may be connected to a U terminal. A connection point between the two diodes may be connected to an M terminal.

Either the first current input/output portion or the second current input/output portion may be provided to be closer to a center of the semiconductor device than a center of a region including the three or more conducting portions. The plurality of slits may be provided to the current path portion near the center of the semiconductor device.

The semiconductor device may comprise a first region that includes a current path; a second region that is arranged along a first direction with the first region and includes the three or more conducting portions arranged along the first direction; a third region that is arranged along a second direction, which is perpendicular to the first direction, with the first region and includes a current path electrically connected to the first region; and a fourth region that is arranged along the second direction with the second region and along the first direction with the third region and includes a current path electrically connected to each of the second region and the third region. The plurality of slits may be provided to the current path portion reaching the conducting portion arranged closest to the first region, among a plurality of current path portions, which are each the current path portion, electrically connected respectively to the three or more conducting portions provided in the second region.

According to a second aspect of the present invention, provided is a semiconductor device comprising a semiconductor chip; a first current input/output portion and a second current input/output portion electrically connected to the semiconductor chip; a plurality of conducting portions that are provided with the semiconductor chip and provided between the first current input/output portion and the second current input/output portion; and a plurality of current path portions that include paths through which current is conducted to the plurality of conducting portions, wherein the plurality of current path portions include a plurality of current paths of different materials.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to solutions provided by aspects of the invention.

In this specification, one side of the semiconductor substrate of the semiconductor chip in one direction parallel to a depth direction is referred to as the "top" and the side of the semiconductor substrate in the other direction parallel to the depth direction is referred to as the "bottom". Among the two surfaces of each of a substrate, layers, and other components, one surface is referred to as the "top surface" and the other surface is referred to as the "bottom surface." The directions of the "top", "bottom", "front", and "back" are not limited to the direction of gravity or to the direction of attachment to the substrate or the like when the semiconductor device is implemented.

In this specification, there are cases where technical concepts are described using orthogonal coordinate axes of the X-axis, the Y-axis, and the Z-axis. In this specification, a plane parallel to the top surface of the semiconductor chip is defined as the XY-plane, and a depth direction of the semiconductor substrate of the semiconductor chip is defined as the Z-axis.

Furthermore, in this specification, there are cases where magnitudes of distance, inductance, current, and the like are described as being equal. Being "equal" is not limited to being exactly the same, and these magnitudes may differ within a range not departing from the invention described in this specification.

Figure 1:
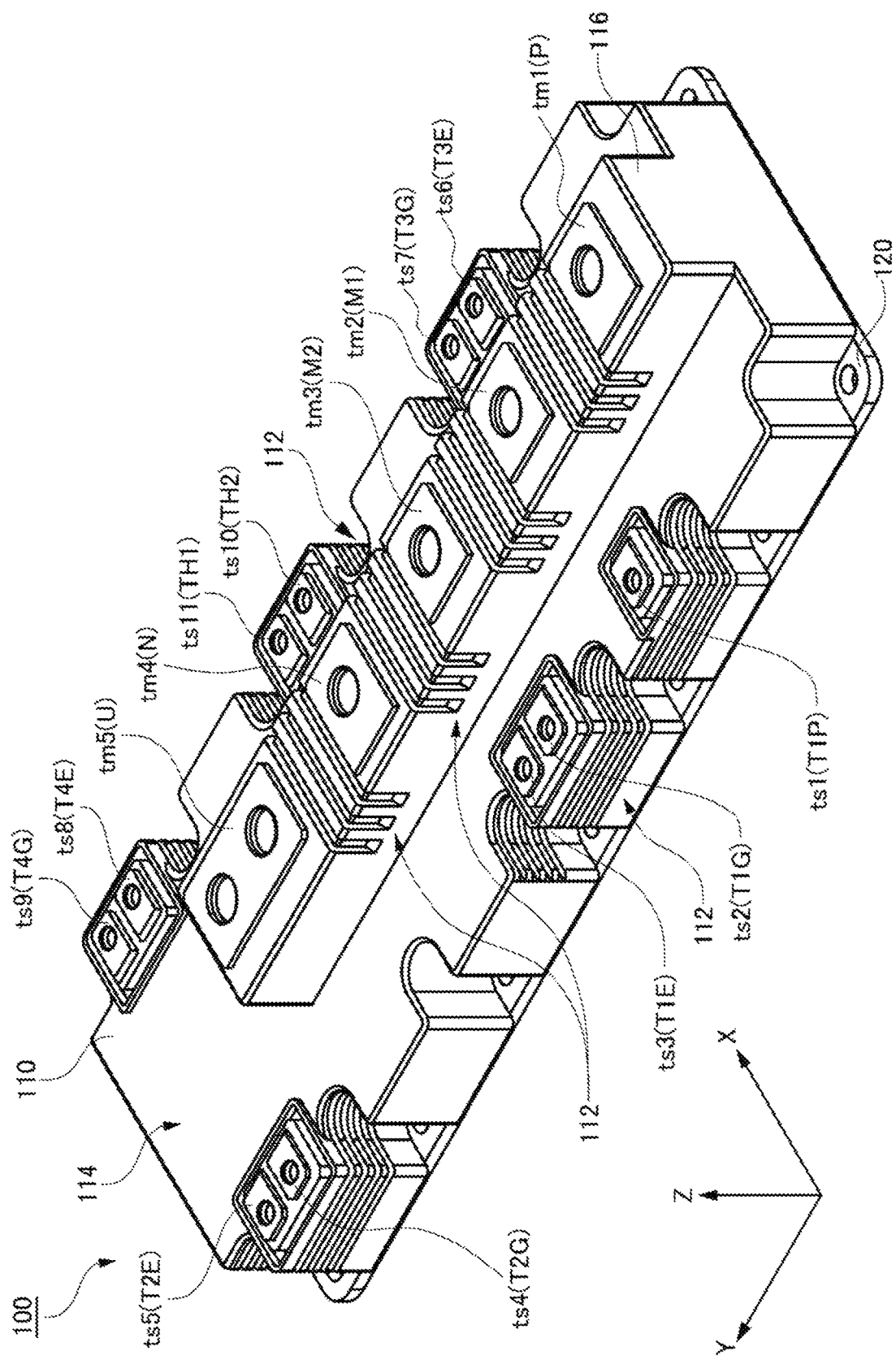
FIG. 1 is an example of a perspective view of a semiconductor device 100 according to an example

FIG. 1 is an example of a perspective view of a semiconductor device 100 according to an example. The semiconductor device 100 includes a case portion 110, a base portion 120, and a plurality of terminals. In one example, the semiconductor device 100 is applied to a power conditioning subsystem (PCS).

The case portion 110 houses semiconductor chips of the semiconductor device 100. The case portion 110 is molded with an insulating resin. The case portion 110 is provided on the base portion 120. The case portion 110 may be provided with a cut-out portion 112 for ensuring insulation.

The base portion 120 is fixed to the case portion 110 by screws or the like. The case portion 110 may be provided with holes for fixing the base portion 120 thereto. The base portion 120 may be set to a ground potential. The base portion 120 has a main surface in the XY-plane.

A terminal arrangement surface 114 is a surface where a terminal portion is provided on the top surface side of the case portion 110. The terminal arrangement surface 114 is provided with a first auxiliary terminal ts1 to an eleventh auxiliary terminal ts11. The terminal arrangement surface 114 includes a protruding portion 116 that protrudes in the Z-axis direction.

The protruding portion 116 is provided near the center of the terminal arrangement surface 114. The protruding portion 116 is provided extending in a longitudinal direction of the terminal arrangement surface 114 (the Y-axis direction in the present example). A first external connection terminal tm1 to a fifth external connection terminal tm5 are provided on the protruding portion 116. The first external connection terminal tm1 to the fifth external connection terminal tm5 are provided in the stated order from the negative Y-axis direction side to the positive Y-axis direction side on the protruding portion 116, but the arrangement is not limited to this.

The first external connection terminal tm1 (P) is a positive terminal P of a DC power source. The second external connection terminal tm2 (M1) and the third external connection terminal tm3 (M2) are middle terminals M. The fourth external connection terminal tm4 (N) is a negative terminal N of the DC power source. The fifth external connection terminal tm5 (U) is an AC output terminal U.

The first auxiliary terminal ts1 to the fifth auxiliary terminal ts5 are provided at an end portion of the terminal arrangement surface 114 on the negative X-axis direction side. The sixth auxiliary terminal ts6 to the eleventh auxiliary terminal ts11 are provided at an end portion of the terminal arrangement surface 114 on the positive X-axis direction side.

The first auxiliary terminal ts1 (T1P) outputs a collector voltage of a transistor T1, which is described below. The second auxiliary terminal ts2 (T1G) is a gate terminal that supplies a gate voltage of the transistor T1. The third auxiliary terminal ts3 (T1E) outputs an emitter voltage of the transistor T1.

The fourth auxiliary terminal ts4 (T2G) is a gate terminal that supplies a gate voltage of a transistor T2, which is described further below. The fifth auxiliary terminal ts5 (T2E) outputs an emitter voltage of the transistor T2.

The sixth auxiliary terminal ts6 (T3E) outputs an emitter voltage of a transistor T3, which is described further below. The seventh auxiliary terminal ts7 (T3G) is a gate terminal that supplies the gate voltage of the transistor T3.

The eighth auxiliary terminal ts8 (T4E) outputs an emitter voltage of a transistor T4, which is described further below. The ninth auxiliary terminal ts9 (T4G) is a gate terminal that supplies the gate voltage of the transistor T4.

The tenth auxiliary terminal ts10 (TH2) and the eleventh auxiliary terminal ts11 (TH1) are thermistor terminals connected to a thermistor that is embedded inside a central portion of the case portion 110 and detects an internal temperature of the case portion 110.

Figure 2:
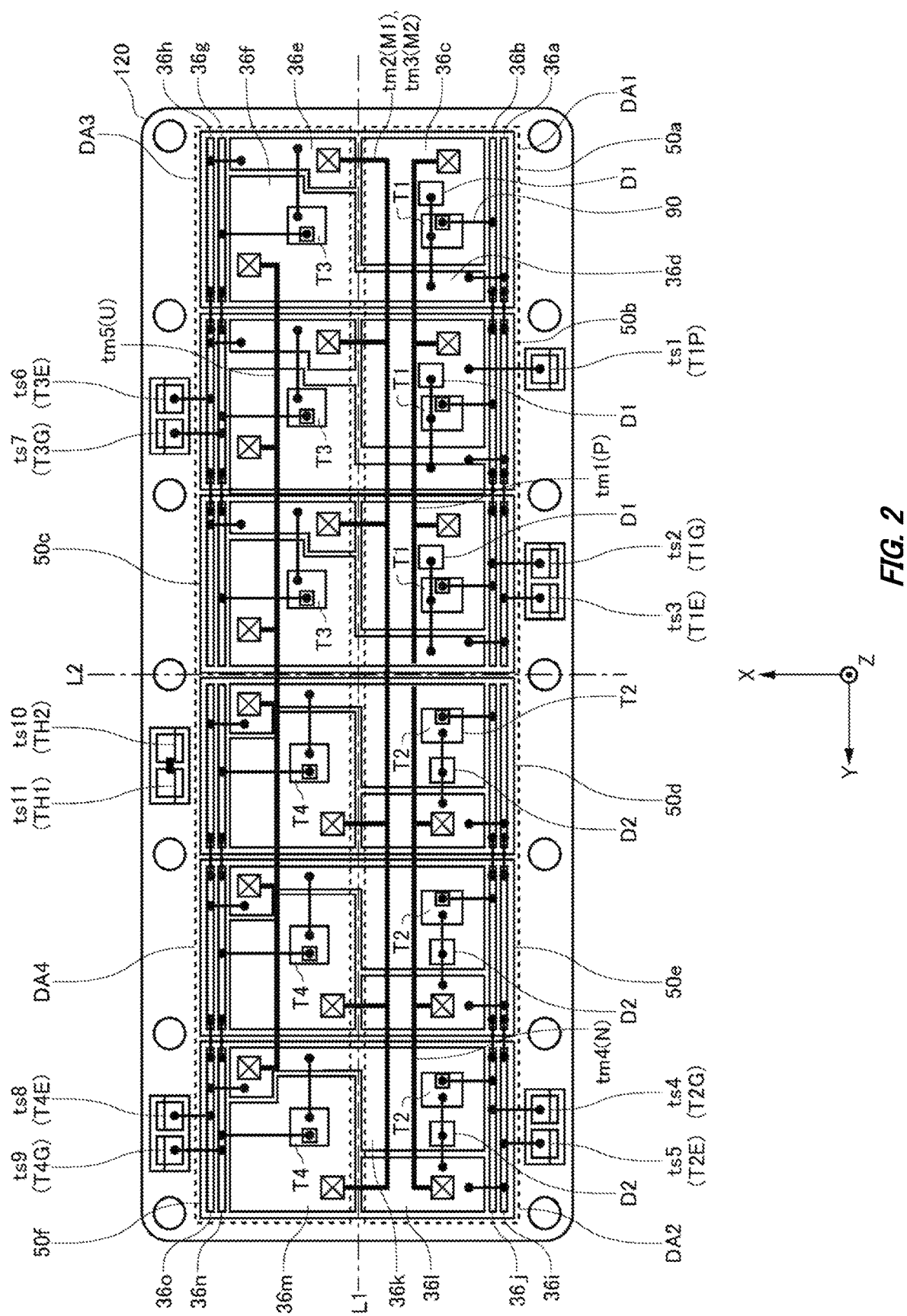
FIG. 2 is an example of a planar view of the semiconductor device 100 according to the example

FIG. 2 is an example of a planar view of the semiconductor device 100 according to an example. This drawing shows an example of an arrangement of circuits provided on the base portion 120 inside the case portion 110.

The semiconductor device 100 of the present example includes six insulating substrates 50a to 50f on the base portion 120. The four transistors T1 to T4 form a circuit for one phase among three phases of a three-level power conversion apparatus (inverter) circuit. Among the four transistors T1 to T4, the transistors T1 and T3 are implemented on one insulating substrate 50, and the transistors T2 and T4 are implemented on another insulating substrate 50. Among the transistors T1 to T4, the transistors T3 and T4 may be reverse-blocking insulated gate bipolar transistors (IGBTs).

The insulating substrates 50 are bonded to the base portion 120. Each insulating substrate 50 has a conductive pattern on each side of a ceramic (e.g. alumina) substrate with good heat transfer. By adjusting the conductive patterns 36, the inductances of the current paths in the insulating substrates 50 are adjusted. As an example, the insulating substrates 50 are DCB (Direct Copper Bond) substrates in which copper circuit boards are directly bonded to ceramic substrates.

The insulating substrates 50a to 50c are each an insulating substrate on which the transistors T1 and T3 are implemented. The insulating substrates 50a to 50c are connected in parallel.

The insulating substrates 50d to 50f are each an insulating substrate on which the transistors T2 and T4 are implemented. The insulating substrates 50d to 50f are connected in parallel.

The semiconductor device 100 includes a region DA1, a region DA2, a region DA3, and a region DA4. The regions DA1 to DA4 are regions divided within the case portion 110 by a center line L1 and a center line L2. The center line L1 is a straight line parallel to the Y-axis, and the center line L2 is a straight line parallel to the X-axis.

The region DA1 is a region in which the transistor T1 and a diode D1 are arranged. The diode D1 is connected in reverse-parallel with the transistor T1. In one example, the diode D1 is a freewheeling diode (FWD). In the present example, the transistor T1 and the diode D1 are arranged in a straight line in the longitudinal direction of the base portion 120.

The region DA2 is a region in which the transistor T2 and a diode D2 are arranged. The diode D2 is connected in reverse-parallel with the transistor T2. In one example, the diode D2 is a freewheeling diode. In the present example, the transistor T2 and the diode D2 are arranged in a straight line in the longitudinal direction of the base portion 120.

The region DA3 is a region in which the transistor T3 is arranged. The transistor T3 is a reverse-blocking insulated gate bipolar transistor as a semiconductor device that serves as a bidirectional switch device, which is described below. The transistor T3 is arranged in a straight line in the longitudinal direction of the base portion 120.

The region DA4 is a region in which the transistor T4 is arranged. The transistor T4 is a reverse-blocking insulated gate bipolar transistor as a semiconductor device that serves as the bidirectional switch device. The transistor T4 is arranged in a straight line in the longitudinal direction of the base portion 120.

A conductive pattern 36a is provided at one end of each of the insulating substrates 50a to 50c. The conductive pattern 36a is electrically connected to the third auxiliary terminal ts3 (T1E) that outputs the emitter voltage of the transistor T1. The conductive pattern 36a of the insulating substrate 50c is connected to the third auxiliary terminal ts3 (T1E), via a connection member 90.

The conductive pattern 36b is provided at one end of each of the insulating substrates 50a to 50c. The conductive pattern 36b is electrically connected to the second auxiliary terminal ts2 (T1G), which serves as the gate terminal supplying the gate voltage of the transistor T1. The conductive pattern 36b is connected to a gate pad of the transistor T1 by the connection member 90. The conductive pattern 36b of the insulating substrate 50c is connected to the second auxiliary terminal ts2 (T1G), via the connection member 90.

The conductive pattern 36c is provided to each of the insulating substrates 50a to 50c. The conductive pattern 36c is arranged in the region DA1 where the transistor T1 is implemented. The conductive pattern 36c is connected to a collector of the transistor T1 and a cathode of the diode D1, via solder including tin or a conductive paste that includes a conductive material such as silver and tin. The conductive pattern 36c of the insulating substrate 50b is connected to the first auxiliary terminal ts1 (T1P), via the connection member 90.

The conductive pattern 36d is provided to each of the insulating substrates 50a to 50c. The conductive pattern 36d is arranged in the region DA1 where the transistor T1 is implemented. The conductive pattern 36d is electrically connected to an emitter of the transistor T1. The conductive pattern 36d is connected to an emitter of the transistor T1 and an anode of the diode D1 by the connection member 90.

The conductive pattern 36h is provided at the other end of each of the insulating substrates 50a to 50c. The conductive pattern 36h is electrically connected to the sixth auxiliary terminal ts6 (T3E) that outputs the emitter voltage of the transistor T3. The conductive pattern 36h of the insulating substrate 50b is connected to the sixth auxiliary terminal ts6 (T3E) via the connection member 90.

The conductive pattern 36g is provided at the other end of each of the insulating substrates 50a to 50c. The conductive pattern 36g is electrically connected to the seventh auxiliary terminal ts7 (T3G) that serves as the gate terminal supplying the gate voltage of the transistor T3. The conductive pattern 36g is connected to a gate pad of the transistor T3 by the connection member 90. The conductive pattern 36g of the insulating substrate 50b is connected to the seventh auxiliary terminal ts7 (T3G), via the connection member 90.

The conductive pattern 36f is provided to each of the insulating substrates 50a to 50c. The conductive pattern 36f is arranged in the region DA3 where the transistor T3 is implemented. The conductive pattern 36f is connected to a collector of the transistor T3, via solder including tin or a conductive paste that includes a conductive material such as silver and tin. Here, the conductive pattern 36f is arranged across the region DA3 and the region DA1, such that the collector of the transistor T3 and the emitter of the transistor T1 are electrically connected to each other.

The conductive pattern 36e is provided to each of the plurality of insulating substrates 50a to 50c. The conductive pattern 36e is arranged in the region DA3 where the transistor T3 is implemented. The conductive pattern 36e is electrically connected to the emitter of the transistor T3. The conductive pattern 36e is connected to the emitter of the transistor T3 by the connection member 90.

The connection member 90 electrically connects the conductive patterns 36 to the transistors T, the diodes D, and the like. For example, the connection member 90 may be bonding wires. The connection member 90 may connect the plurality of insulating substrates 50 to each other.

The conductive pattern 36i is provided at one end of each of the insulating substrates 50d to 50f. The conductive pattern 36i is electrically connected to the fifth auxiliary terminal ts5 (T2E) that outputs the emitter voltage of the transistor T2. The conductive pattern 36i of the insulating substrate 50f is connected to the fifth auxiliary terminal ts5 (T2E) via the connection member 90.

The conductive pattern 36j is provided at the one end of each of the insulating substrates 50d to 50f. The conductive pattern 36j is electrically connected to the fourth auxiliary terminal ts4 (T2G) that serves as the gate terminal supplying the gate voltage of the transistor T2. The conductive pattern 36j is connected to a gate pad of the transistor T2 by the connection member 90. The conductive pattern 36j of the insulating substrate 50f is connected to the fourth auxiliary terminal ts4 (T2G), via the connection member 90.

The conductive pattern 36o is provided to the other end of each of the insulating substrates 50d to 50f. The conductive pattern 36o is electrically connected to the eighth auxiliary terminal ts8 (T4E) that outputs the emitter voltage of the transistor T4. The conductive pattern 36o of the insulating substrate 50f is connected to the eighth auxiliary terminal ts8 (T4E) via the connection member 90.

The conductive pattern 36n is provided to the other end of each of the insulating substrates 50d to 50f. The conductive pattern 36n is electrically connected to the ninth auxiliary terminal ts9 (T4G) that serves as the gate terminal supplying the gate voltage of the transistor T4. The conductive pattern 36n is connected to a gate pad of the transistor T4 by the connection member 90. The conductive pattern 36n of the insulating substrate 50f is connected to the ninth auxiliary terminal ts9 (T4G) via the connection member 90.

The conductive pattern 36k is provided to each of the insulating substrates 50d to 50f. The conductive pattern 36k is arranged in the region DA2 where the transistor T2 is implemented. The conductive pattern 36k is connected to the collector of the transistor T2 and the cathode of the diode D2, via solder including tin or a conductive paste that includes a conductive material such as silver and tin. Here, the conductive pattern 36k is arranged across the region DA2 and the region DA4, in a manner to electrically connect the collector of the transistor T2 and the emitter of the transistor T4 to each other.

The conductive pattern 36l is provided to each of the insulating substrates 50d to 50f The conductive pattern 36l is arranged in the region DA2 where the transistor T2 is implemented. The conductive pattern 36l is electrically connected to the emitter of the transistor T2. The conductive pattern 36l is electrically connected to the emitter of the transistor T2 and the anode of the diode D2, via the connection member 90. The conductive pattern 36l is connected to the conductive pattern 36i by the connection member 90.

A portion of the conductive pattern 36m is also provided to each of the insulating substrates 50d to 50f The conductive pattern 36m is arranged in the region DA4 where the transistor T4 is implemented.

A portion of the conductive pattern 36m is also provided to each of the insulating substrates 50d to 50f The conductive pattern 36m is connected to the collector of the transistor T4 via solder including tin or a conductive paste that includes a conductive material such as silver and tin. A portion of the conductive pattern 36m is electrically connected to the emitter of the transistor T4.

Figure 3:
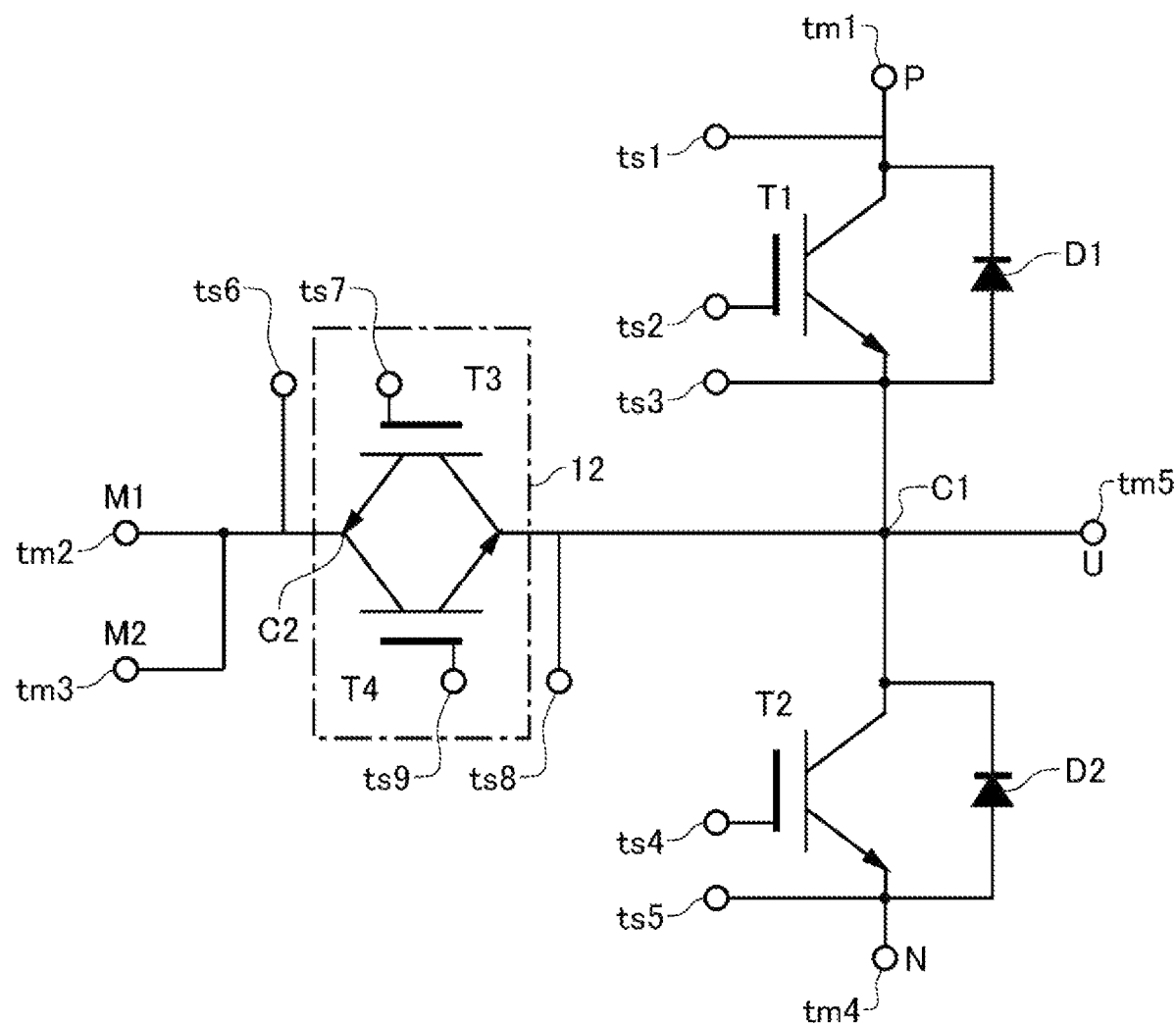
FIG. 3 shows an example of a circuit configuration of one phase of the three-level power conversion circuit (inverter).

FIG. 3 shows an example of a circuit configuration of one phase of the three-level power conversion (inverter) circuit. In the present example, the circuit configuration of the U phase is shown. The circuit configuration of the one phase is formed by the four transistors T1 to T4 and the two diodes D1 and D2. Each of the three or more conducting portions 10 described further below may include the four transistors T1 to T4 and the two diodes D1 and D2. The transistors T1 to T4 of the present example are insulated gate bipolar transistors.

The transistors T1 and T2 are connected in series. The diode D1 is connected in reverse-parallel with the transistor T1. The diode D2 is connected in reverse-parallel with the transistor T2. The collector of the transistor T1 is connected to the first external connection terminal tm1 (P) serving as the positive terminal to be connected to the positive electrode of the DC power source. The emitter of the transistor T2 is connected to the fourth external connection terminal tm4 (N) serving as the negative terminal to be connected to the negative electrode of the DC power source.

A connection point C1 is connected to the emitter of the transistor T1 and the collector of the transistor T2. The connection point C1 is connected to the fifth external connection terminal tm5 (U) serving as the AC output terminal.

The transistors T3 and T4 form a bidirectional switch device 12. One end of the bidirectional switch device 12 is connected to the connection point C1, and the other end of the bidirectional switch device 12 is connected to the M terminal (s). The transistors T3 and T4 are connected to the connection point C1. The M terminal (s) may include the second external connection terminal tm2 (M1) and the third external connection terminal tm3 (M2).

The connection point C2 is a connection point between the emitter of the transistor T3 and the collector of the transistor T4. The connection point C2 is connected to the second external terminal tm2 (M1), which serves as the middle terminal M1 forming the main circuit terminal. Furthermore, the connection point C2 is connected to the third external connection terminal tm3 (M2). The third external connection terminal tm3 (M2) has the same potential as the second external connection terminal tm2 (M1).

In the present example, a T-shaped three-level power conversion circuit is shown as a circuit configuration of an inverter of the semiconductor device 100. However, the semiconductor device 100 may have an I-shaped three-level power conversion circuit instead.

Figure 4A:
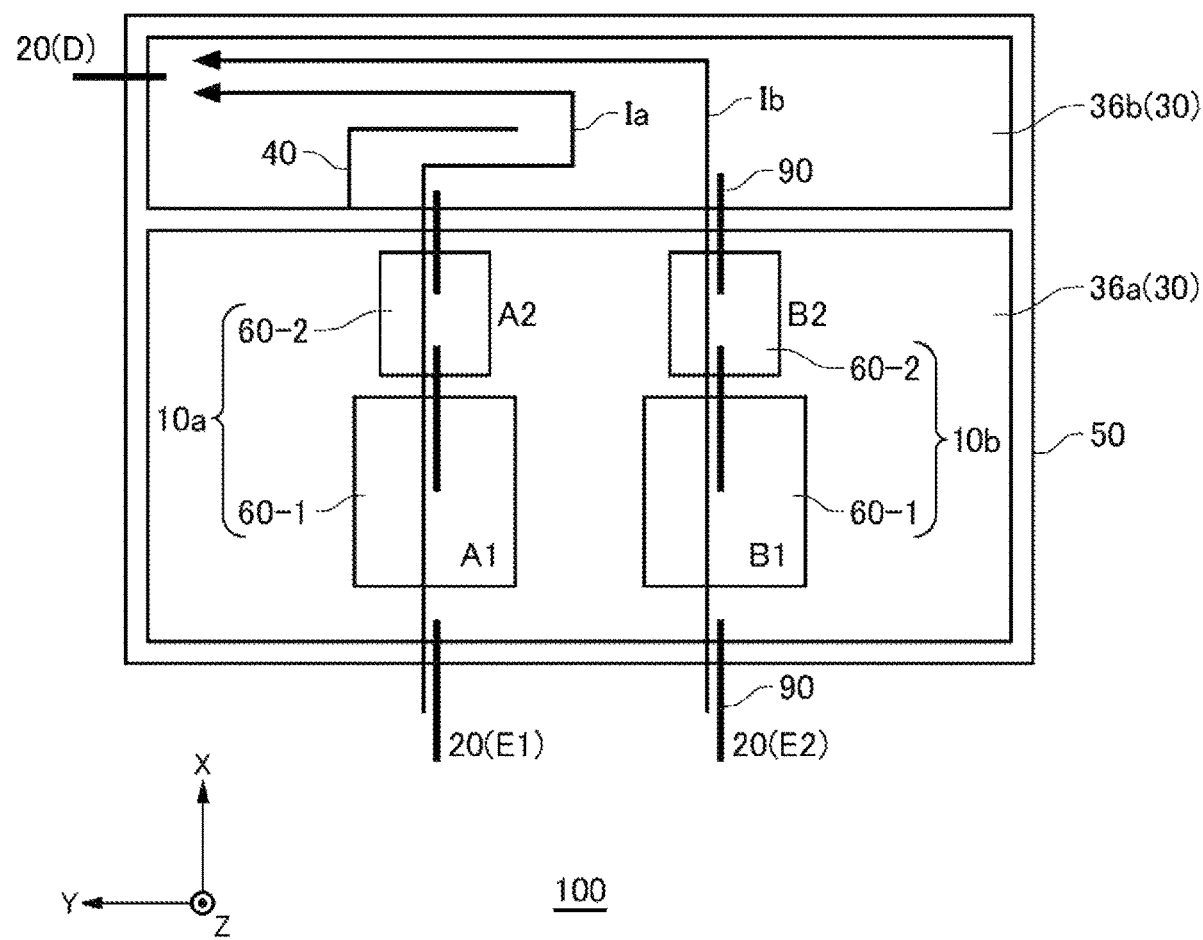
FIG. 4A shows an example of a configuration of the semiconductor device 100 according to an example.

FIG. 4A shows an example of a configuration of the semiconductor device 100 according to an example. The semiconductor device 100 includes a conducting portion 10, a current input/output portion 20, a current path portion 30, and an insulating substrate 50. The insulating substrate 50 includes a conductive pattern 36 provided with a slit 40.

The conducting portion 10 is a member that conducts current. In one example, the conducting portion 10 is a semiconductor chip 60 provided on the insulating substrate 50. The conducting portion 10 of the present example includes two conducting portions, which are a conducting portion 10a and a conducting portion 10b. The conducting portion 10a is an example of a first conducting portion, and the conducting portion 10b is an example of a second conducting portion.

The conducting portion 10a includes a semiconductor chip 60-1 and a semiconductor chip 60-2 as semiconductor chips 60. The conducting portion 10a includes a transistor portion A1 as the semiconductor chip 60-1. The conducting portion 10a includes a diode portion A2 as the semiconductor chip 60-2. As an example, the transistor portion A1 is an IGBT and the diode portion A2 is an FWD.

The conducting portion 10b includes a semiconductor chip 60-1 and a semiconductor chip 60-2 as semiconductor chips 60. The conducting portion 10b includes a transistor portion B1 as the semiconductor chip 60-1. The conducting portion 10b includes a diode portion B2 as the semiconductor chip 60-2. As an example, the transistor portion B1 is an IGBT and the diode portion B2 is an FWD.

Each semiconductor chip 60 may include any of the transistors T1 to T4 shown in FIG. 2. Furthermore, the semiconductor chip 60 may include the diode D1 and the diode D2 shown in FIG. 2. The semiconductor chip 60-2 of the present example is connected in series with the semiconductor chip 60-1. For example, the diode portion A2 is connected in series with the transistor portion A1. Furthermore, the diode portion B2 is connected in series with the transistor portion B1. The semiconductor chip 60-1 and the semiconductor chip 60-2 may be RC-IGBTs provided on the same chip.

The current input/output portion 20 is electrically connected to the semiconductor chip 60. The current input/output portion 20 includes a current input portion E and a current output portion D. The conducting portion 10 is provided between the current input portion E and the current output portion D. The current input portion E is an example of a first current input/output portion, and the current output portion D is an example of a second current input/output portion. The current input/output portion 20 of the present example includes two current input portions E1 and E2, and one current output portion D. The current input/output portion 20 is a bonding wire, for example. However, as long as the current input/output portion 20 is a component that can input and output current, such as a terminal or ribbon, the current input/output portion 20 is not limited to being a bonding wire.

The current input portion E1 and the current input portion E2 are provided corresponding respectively to the conducting portion 10a and the conducting portion 10b. The current input portion E1 and the current input portion E2 are provided such that the distance between the current input portion E1 and the conducting portion 10a and the distance between the current input portion E2 and the conducting portion 10b are equal. The current output portion D of the present example is provided closer to the conducting portion 10a than to the conducting portion 10b. The current input/output portion 20 may instead include a current input portion E that is common to the conducting portion 10a and the conducting portion 10b.

The current path portion 30 includes a path that conducts current through each of the plurality of conducting portions 10. The current path portion 30 of the present example includes two current paths corresponding to two conducting portions 10. The current path portion 30 includes a slit 40 for adjusting the inductances of the current paths. The current path portion 30 includes a conductive pattern 36 provided on the top surface of the insulating substrate 50. In other words, the conductive pattern 36 is an example of a current path portion 30. The current path portion 30 of the present example includes the conductive pattern 36a and the conductive pattern 36b.

Here, the magnitude of the current flowing through the current path portion 30 changes according to the inductance of the current path. By increasing the inductance of the current path, it becomes more difficult for current to flow through the current path. The inductance can be increased by lengthening the current path. By providing a slit and a pattern to the current path portion 30, the current path is lengthened and the inductance is increased. When the inductance is increased, the current flowing through the current path is reduced, and the chip temperature is lowered. When the chip temperature is lowered, the reliability is improved.

The conductive pattern 36a is provided on the top surface of the insulating substrate 50. The semiconductor chip 60 is mounted on the conductive pattern 36a. In one example, the conductive pattern 36a is a collector pattern.

The conductive pattern 36b is provided on the top surface of the insulating substrate 50. The conductive pattern 36b is connected to the semiconductor chip 60-2 by the connection member 90. The conductive pattern 36b includes the slit 40. In one example, the conductive pattern 36 is an emitter pattern.

The conductive pattern 36 includes patterns formed of a conductive material such as copper. The conductive pattern 36 may be formed by any method, including laser machining, etching, punching, and the like. As long as the conductive pattern 36 manufacturing method can form the predetermined slit 40, this method is not particularly limited.

The slit 40 includes a material with lower electrical conductivity than the conductive pattern 36. The slit 40 is provided by forming a cut-out in the conductive pattern 36, for example. The slit 40 adjusts the length of the current path passing through the transistor portion A1 and the diode portion A2. The slit 40 may adjust the length of the current path passing through the transistor portion B1 and the diode portion B2.

The slit 40 of the present example is L-shaped. One slit 40 of the present invention is provided in the conductive pattern 36. By providing the slit 40, the current path is lengthened to increase the inductance. The slit 40 of the present example is adjusted such that the current path passing through the transistor portion A1 and the diode portion A2 and the current path passing through the transistor portion B1 and the diode portion B2 have the same length. As long as the slit 40 adjusts the length of the current path, the shape of the slit 40 is not limited to the shape of the present example. For example, the shape of the slit 40 is one of a straight line shape such as an I shape, a bent line shape such as an L shape, a branching shape such as an F shape, a curved shape such as a U shape, and a combination of these shapes.

The width of the slit 40 may be adjusted to a size suitable for adjusting the inductance of the conductive pattern 36. By increasing the width of the slit 40, the width of the current path is reduced and it becomes easier to increase the inductance. Furthermore, by decreasing the width of the slit 40, it is possible to increase width of the current path to adjust the amount of increase of the inductance. As an example, the width of the slit 40 is from 0.8 mm to 1.0 mm.

The slit 40 is not necessarily formed by forming a cut-out in the current path portion 30, and the current path portion 30 member itself may have a pattern similar to the pattern using the slit 40. In other words, a case in which the current path portion 30 includes the slit 40 may also include a case in which the current path portion 30 is formed with any pattern.

The semiconductor device 100 of the present example adjusts the inductance on the current output portion D side of the semiconductor chip 60. In other words, the slit 40 of the present example is provided on the current output portion D side of the conducting portion 10, in the conductive pattern 36. The slit 40 may alternatively be provided on the current input portion E side of the conducting portion 10, in the conductive pattern 36. Furthermore, slits 40 may be provided in the conductive pattern 36 both on the current input portion E side and the current output portion D side of the conducting portion 10.

A current Ia is input to the current input portion E1 and passes through the conducting portion 10a. Furthermore, the current Ia is output from the current output portion D, via the conductive pattern 36b. In other words, the current path through which the current Ia flows includes an inductance La corresponding to a path passing through E1-A1-A2-D.

A current Ib is input to the current input portion E2 and passes through the conducting portion 10b. Furthermore, the current Ib is output from the current output portion D, via the conductive pattern 36b. In other words, the current path through which the current Ib flows includes an inductance La corresponding to a path passing through E2-B1-B2-D.

In the semiconductor device 100 of the present example, the inductance La is increased by providing the slit 40. The inductance La of the present example is equal to the inductance Lb. Therefore, the current Ia is equal to the current Ib, and the current imbalance is ameliorated. Accordingly, in the semiconductor device 100, the reliability of the transistor portion A1 and the diode portion A2 of the semiconductor chip 60 can be improved.

Furthermore, the semiconductor device 100 may be provided with the current input/output portion 20 at any position. By changing the shape of the slit 40 according to the position of the current input/output portion 20, it is possible to adjust the inductance of the current path portion 30 in the semiconductor device 100. In this way, the current input/output portion 20 can be arranged freely in the semiconductor device 100 of the present example, and therefore it is possible to improve the degree of freedom of the wiring.

In this specification, the semiconductor device 100 is described as including the conducting portions 10, the current input/output portion 20, and the current path portion 30. The semiconductor device 100 of the present example includes the semiconductor chips 60 serving as the conducting portions 10, the connection member 90 serving as the current input/output portion 20, and the conductive patterns 36 serving as the current path portion 30. However, the specific configurations of the conducting portion 10, the current input/output portion 20, and the current path portion 30 may differ from one example to another. That is, the conducting portions 10 may be insulating substrates 50 that include semiconductor chips 60. The current path portion 30 may be a lead frame 32 and a terminal bar 34, which are described further below.

Figure 4B:
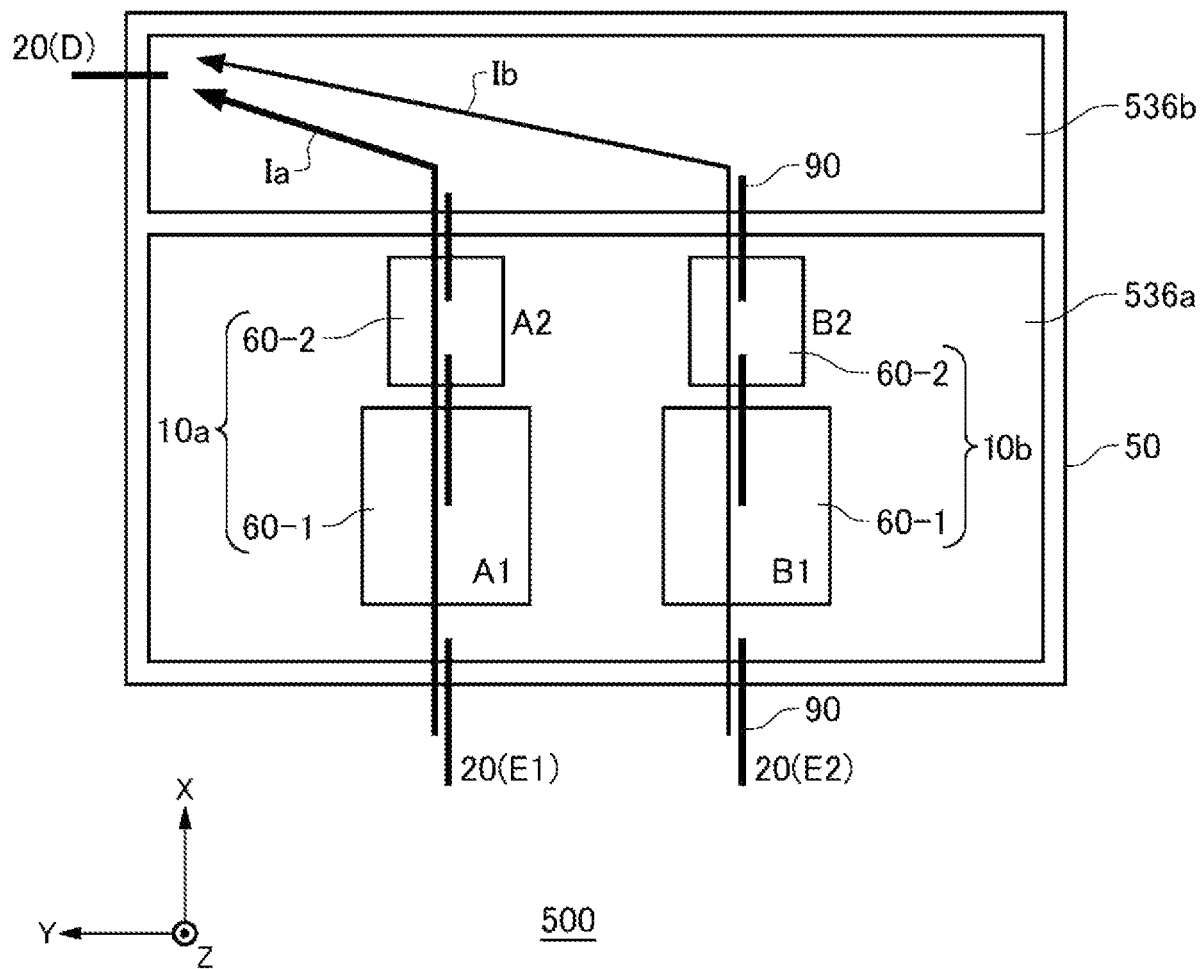
FIG. 4B shows an example of a configuration of the semiconductor device 500 according to a comparative example

FIG. 4B shows an example of a configuration of a semiconductor device 500 according to a comparative example. The semiconductor device 500 of the present example differs from the semiconductor device 100 according to the example shown in FIG. 4A in that the semiconductor device 500 does not include the slit 40 in the conductive patterns 536.

The semiconductor device 500 does not include the slit 40, and therefore it is impossible to adjust the length of the current path passing through the transistor portion A1 and the diode portion A2 and the length of the current path passing through the transistor portion B1 and the diode portion B2. In this way, since the inductances of the plurality of current paths in the semiconductor device 500 are not the same, a current imbalance is likely to occur. When a current imbalance occurs, the current is prone to flow through a certain semiconductor chip 60, and the chip temperature increases. The chip at a high temperature has a shorter lifetime than other chips.

As an example, the inductance La is less than the inductance Lb. Therefore, the current Ia is larger than the current Ib. Accordingly, the heat generation of the transistor portion A1 and the diode portion A2 is greater than the heat generation of the transistor portion B1 and the diode portion B2. Due to this, the transistor portion A1 and the diode portion A2 have shortened lifetimes and are likely to break down.

Figure 5A:
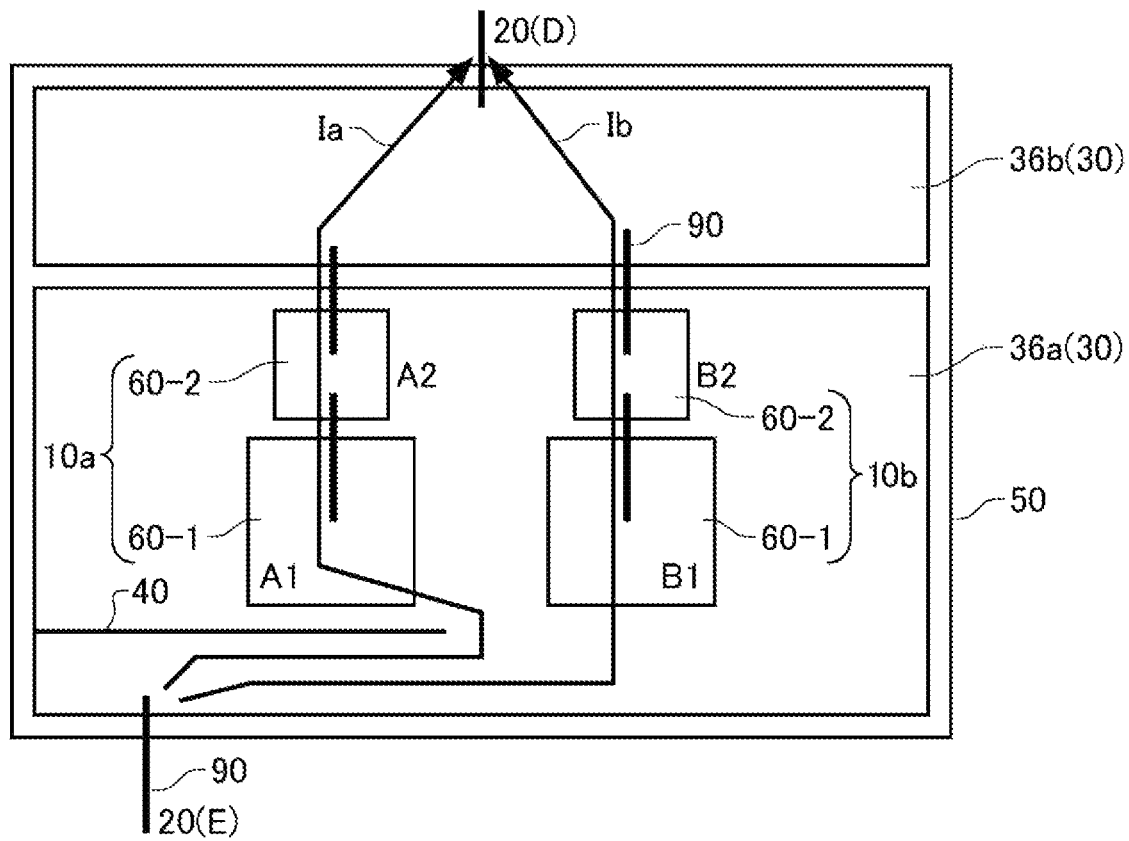
FIG. 5A shows an example of a configuration of the semiconductor device 100 according to an example.

FIG. 5A shows an example of a configuration of the semiconductor device 100 according to an example. The semiconductor device 100 of the present example differs from the semiconductor device 100 according to FIG. 4A in that, in the semiconductor device 100 of the present example, the inductance is adjusted on the current input portion E side of the conducting portion 10. In the present example the description focuses on points that are different than in FIG. 4A. In other examples as well, the slit 40 may be provided on the current input portion E side of the conducting portion 10 as shown in the present example The conductive pattern 36a includes the slit 40. The conductive pattern 36a includes the current input portion E closer to the conducting portion 10a than to the conducting portion 10b. Therefore, the inductance of the current path between the conducting portion 10a and the current input portion E is less than the inductance of the current path between the conducting portion 10b and the current input portion E.

The conductive pattern 36b does not need to include the slit 40. The conductive pattern 36b includes the current output portion D at a position where the distance to the conducting portion 10a and the distance to the conducting portion 10b are equal. Therefore, the inductance of the current path between the conducting portion 10a and the current output portion D is equal to the inductance of the current path between the conducting portion 10b and the current output portion D.

By providing the slit 40 to the semiconductor device 100 of the present example, the inductance La is increased. The inductance La of the present example is equal to the inductance Lb. Therefore, the current Ia is equal to the current Ib, and the current imbalance is ameliorated. Accordingly, in the semiconductor device 100, it is possible to improve the reliability of the transistor portion A1 and the diode portion A2 of the semiconductor chip 60.

Figure 5B:
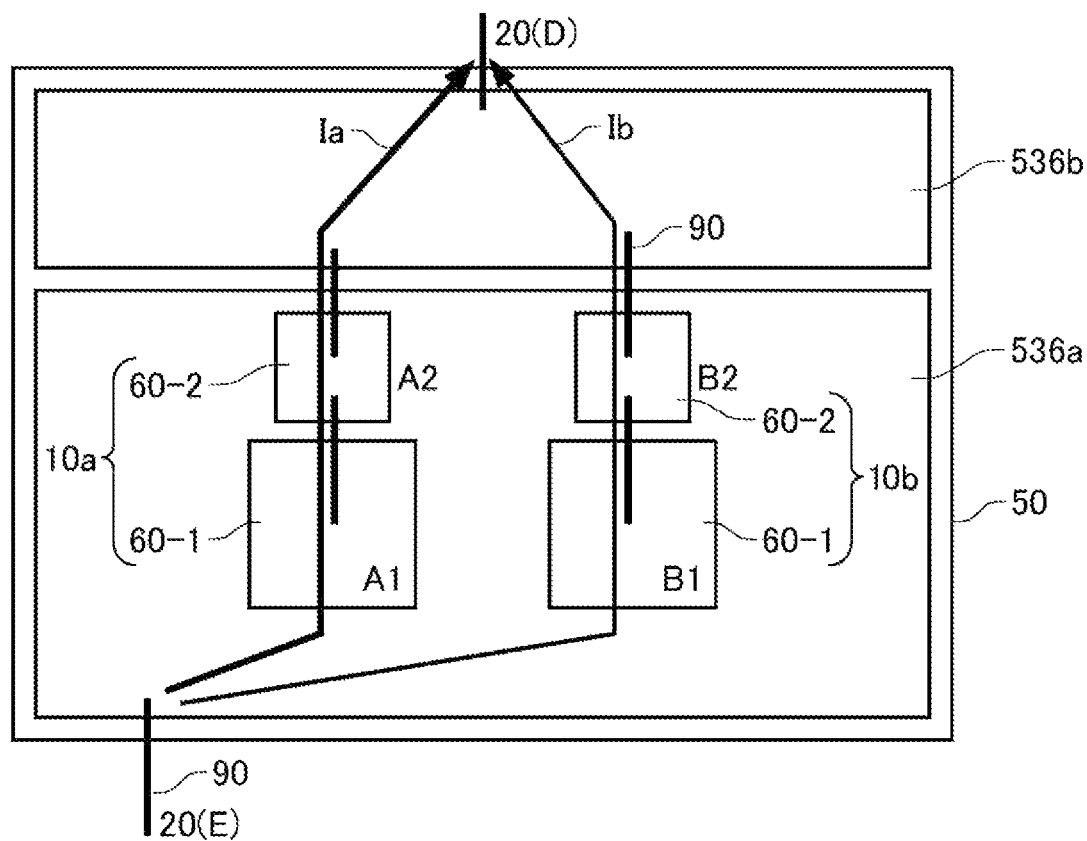
FIG. 5B shows an example of a configuration of the semiconductor device 500 according to a comparative example

FIG. 5B shows an example of a configuration of the semiconductor device 500 according to the comparative example. The semiconductor device 500 of the present example differs from the semiconductor device 100 according to the example of FIG. 5A in that the semiconductor device 500 does not include the slit 40 in the conductive patterns 536.

Since the semiconductor device 500 does not include the slit 40, it is impossible to adjust the length of the current path passing through the transistor portion A1 and the diode portion A2 and the length of the current path passing through the transistor portion B1 and the diode portion B2. As an example, the inductance La is less than the inductance Lb. Therefore, the current Ia is larger than the current Ib. Accordingly, the heat generation of the transistor portion A1 and the diode portion A2 is greater than the heat generation of the transistor portion B1 and the diode portion B2. Due to this, the transistor portion A1 and the diode portion A2 have shortened lifetimes and are likely to break down.

Figure 6A:
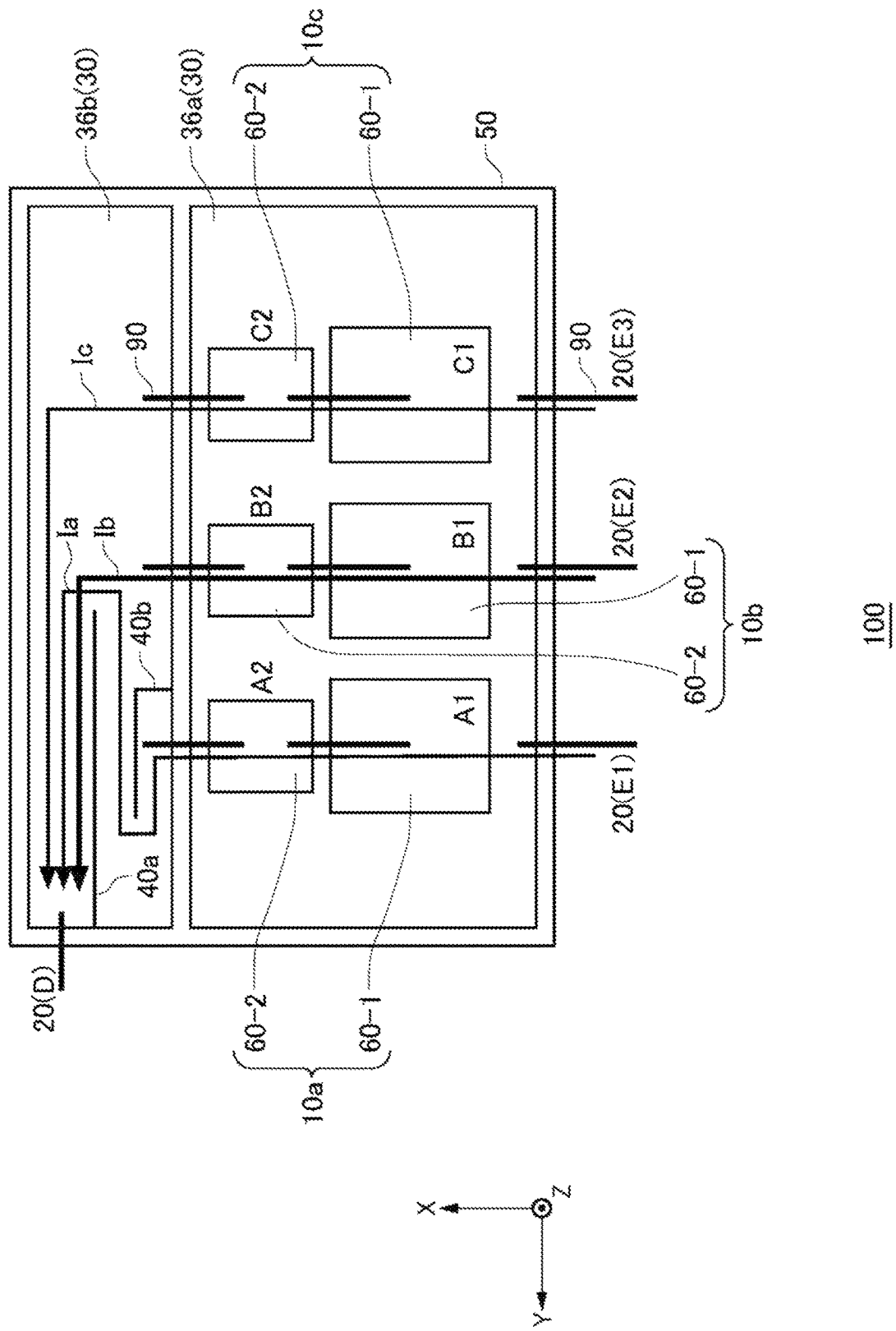
FIG. 6A shows an example of a semiconductor device 100 that includes three conducting portions 10.

FIG. 6A shows an example of a semiconductor device 100 that includes three conducting portions 10. The semiconductor device 100 of the present example differs from the semiconductor device 100 according to FIG. 4A in that the semiconductor device 100 of the present example includes three conducting portions 10a to 10c. In the present example, the description focuses on points that differ from those of the semiconductor device 100 according to FIG. 4A. The semiconductor device 100 of the present example includes semiconductor chips 60 serving as the conducting portions 10. The conducting portion 10a, the conducting portion 10b, and the conducting portion 10c each include a semiconductor chip 60-1 and a semiconductor chip 60-2 as the semiconductor chips 60.

The current path portion 30 includes a path for current conducted through each of the plurality of conducting portions 10, between the current input portions E and the current output portion D. The current path portion 30 of the present example includes paths for three currents conducted respectively through the conducting portions 10a to 10c. The current path portion 30 electrically connects the current input/output portion 20 and the conducting portions 10. In one example, the current paths are adjusted by changing the shape and material of the current path portion 30. For example, by providing the current path portion 30 with one or more slits 40, the inductance of each current path is adjusted. Furthermore, the inductances may be adjusted by changing the patterns of the current paths in the current path portion 30. The current path portion 30 electrically connects the current input/output portion 20 and the three or more conducting portions 10.

The current path portion 30 of the present example includes a plurality of slits 40. The plurality of slits 40 refer to end portions of a plurality of slits being provided in an end portion of the current path portion 30. In other words, each slit 40 may be provided in a branching manner in the current path portion 30.

The semiconductor device 100 includes three or more conducting portions 10. Even in a case where the semiconductor device 100 includes three or more conducting portions 10, the inductance corresponding to each conducting portion 10 may be adjusted by providing the slit 40 in a similar manner.

In the present example, the three conducting portions 10a to 10c are provided in the stated order from the positive side to the negative side in the Y-axis direction. The three conducting portions 10a to 10c are provided at uniform intervals, but may be provided at differing intervals. The three conducting portions 10a to 10c are not limited to being arranged in the Y-axis direction, and may be arranged in another direction in the XY-plane.

A current Ic is input to the current input portion E3 and passes through the conducting portion 10c. Furthermore, the current Ic is output from the current output portion D, via the conductive pattern 36b. Essentially, the current path through which the current Ic flows has an inductance Lc corresponding to a path that passes through E3-C1-C2-D. The current output portion D of the present example is provided at an end portion of the conductive pattern 36b on the positive Y-axis direction side.

The conductive pattern 36a does not need to include the slit 40. The conductive pattern 36a includes current input portions E1 to E3 at positions corresponding respectively to the conducting portions 10a to 10c. Therefore, the inductance of the current path between the conducting portion 10a and the current input portion E1, the inductance of the current path between the conducting portion 10b and the current input portion E2, and the inductance of the current path between the conducting portion 10c and the current input portion E3 are equal. The current input portions E1 to E3 of the present example are provided at an end portion of the conductive pattern 36a on the negative X-axis direction side. Furthermore, the current input portions E1 to E3 of the present example are provided in the stated order from the positive side to the negative side in the Y-axis direction.

The conductive pattern 36b includes slits 40. The conductive pattern 36b includes the current output portion D closer to the conducting portion 10a than to the conducting portion 10b and the conducting portion 10c. Therefore, if the slits 40 were not provided, the inductance of the current path between the conducting portion 10a and the current output portion D would be less than the inductance of the current path between the conducting portion 10b and the current output portion D and the inductance of the current path between the conducting portion 10c and the current output portion D. The conductive pattern 36b of the present example is provided adjacent to positive X-axis direction side of the conductive pattern 36a.

The slits 40 includes two slits, which are the slit 40a and the slit 40b. By combining the slit 40a and the slit 40b, the slits 40 can increase the inductance La of the path through which the current Ia flows. The slit 40a has two end portions, with one end portion being open at the end portion of the conductive pattern 36b, which is the end portion on the positive Y-axis direction side, and the other end portion being closed inside the conductive pattern 36b. The slit 40b has two end portions, with one end portion being open at the end portion of the conductive pattern 36b, which is the end portion on the negative Y-axis direction side, and the other end portion being closed inside the conductive pattern 36b.

The slit 40a is an I-shaped slit, for example. An end portion of the slit 40a is provided between the current output portion D and the current path of the conducting portion 10a. Essentially, the slit 40a is provided extending inside the conductive pattern 36b from an end portion of the conductive pattern 36b provided between the current output portion D and the conducting portion 10a in a direction away from the current output portion D. The slit 40a of the present example is an I-shaped slit that extends inside the conductive pattern 36b from the positive side toward the negative side in the Y-axis direction. The slit 40a is an example of a first slit.

The slit 40b is an L-shaped slit, for example. An end portion of the slit 40b is provided between the current path of the conducting portion 10a and the current path of the conducting portion 10b. Essentially, the slit 40b is provided extending inside the conductive pattern 36b from an end portion of the conductive pattern 36b provided between the current path of the conducting portion 10a and the current path of the conducting portion 10b toward the current output portion D. The slit 40b of the present example extends inside the conductive pattern 36b from the negative side toward the positive side in the X-axis direction and then extends from the negative side toward the positive side in the Y-axis direction, thereby forming an L-shaped slit. The slit 40b is arranged between the slit 40a and the conducting portions 10a and 10b, in a top plan view. The slit 40b is an example of a second slit.

By providing the slits 40 in the semiconductor device 100 of the present example, the inductance La is increased. The inductance La of the present example may be equal to the inductance Lc. Therefore, the current Ia and the current Ic are equal, and the current imbalance is ameliorated. Accordingly, it is possible to improve the reliability of the transistor portion A1 and the diode portion A2 of the semiconductor chip 60 in the semiconductor device 100. The inductance La and the inductance Lc of the present example may be greater than the inductance Lb.

Figure 6B:
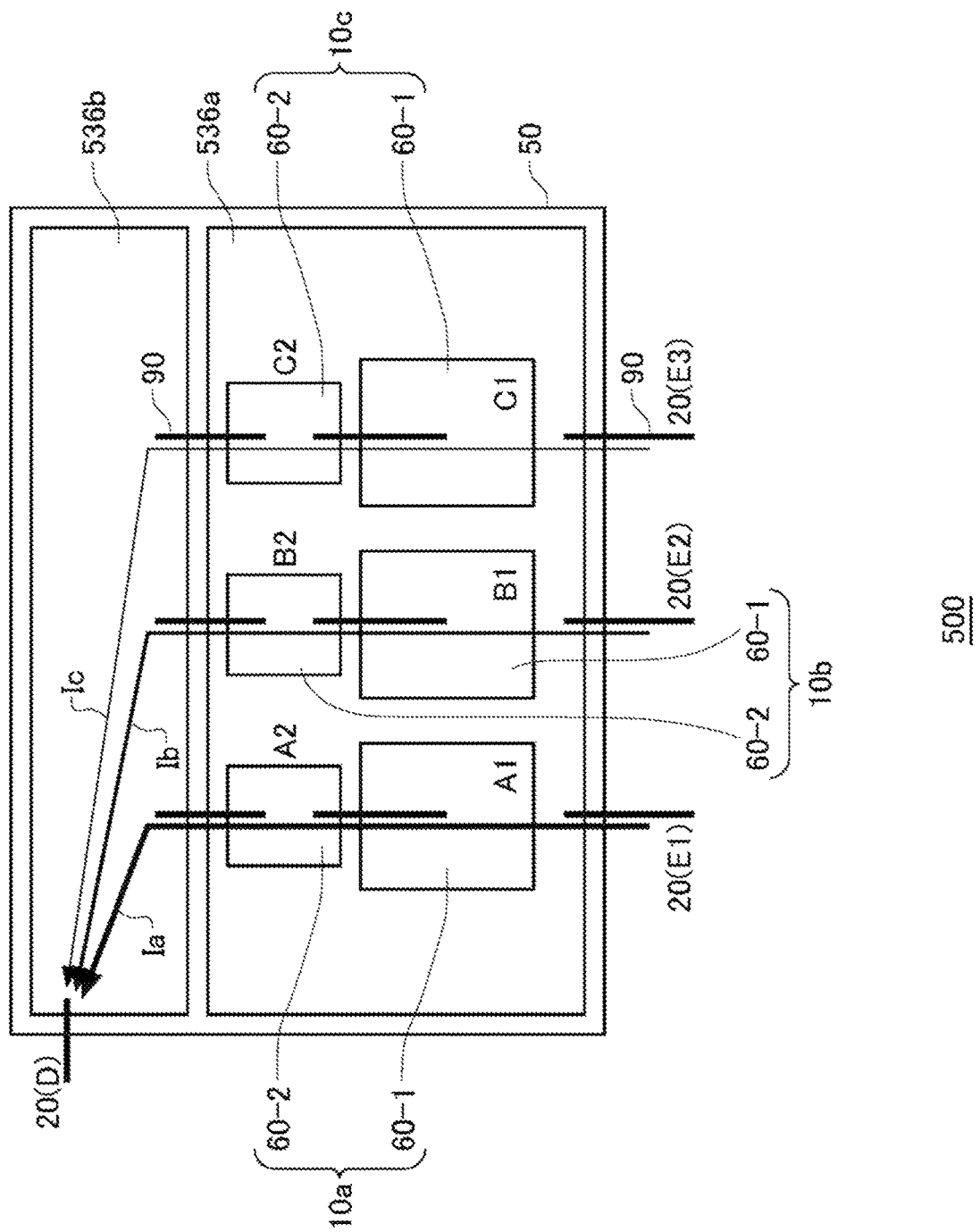
FIG. 6B shows an example of a configuration of the semiconductor device 500 according to a comparative example

FIG. 6B shows an example of a configuration of the semiconductor device 500 according to a comparative example. The semiconductor device 500 of the present example differs from the semiconductor device 100 according to the example of FIG. 6A in that the semiconductor device 500 does not include the slits 40 in the conductive patterns 536.

Since the semiconductor device 500 does not include the slits 40, it is impossible to adjust the length of the current path passing through the transistor portion A1 and the diode portion A2 and the length of the current path passing through the transistor portion C1 and the diode portion C2. For example, a relationship of Lc>Lb>La is established. Therefore, the current Ia is larger than the current Ib, and the current Ib is larger than the current Ic. Accordingly, the heat generation of the transistor portion A1 is greater than the heat generation of the transistor portion B1 and the transistor portion C1. Furthermore, the heat generation of the diode portion A2 is greater than the heat generation of the diode portion B2 and the diode portion C2. Due to this, the transistor portion A1 and the diode portion A2 have shortened lifetimes and are likely to break down.

Figure 7A:
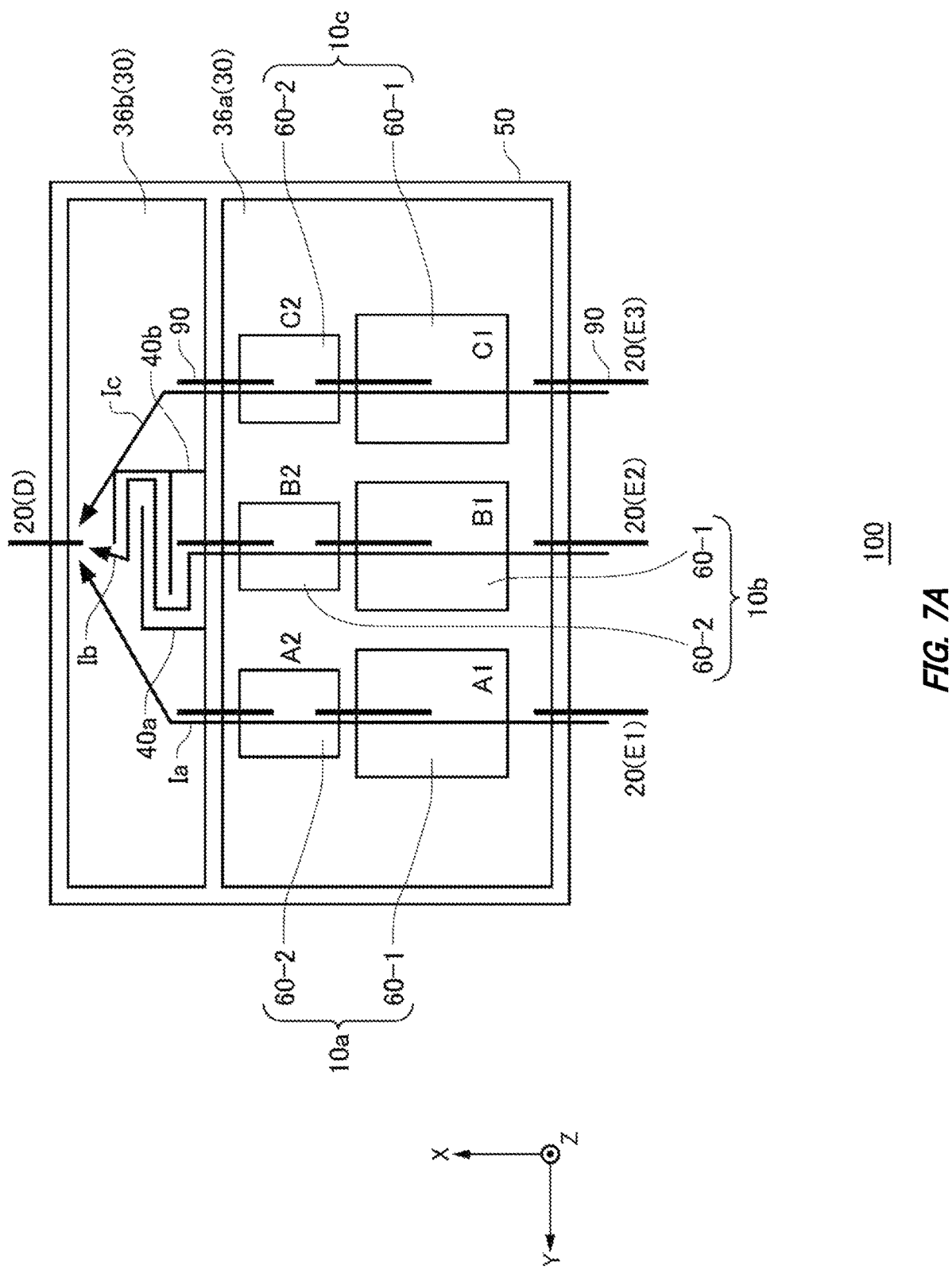
FIG. 7A shows an example of a configuration of the semiconductor device 100 according to an example.

FIG. 7A shows an example of a configuration of the semiconductor device 100 according to an example. The semiconductor device 100 of the present example differs from the semiconductor device 100 according to FIG. 6A in that the three inductances La to Lc are adjusted to be the same in the semiconductor device 100 of the present example. In the present example, the description focuses on the points differing from those of FIG. 6A. The semiconductor device 100 of the present example includes the semiconductor chips 60 as the conducting portions 10.

The conductive pattern 36a does not need to include the slit 40. The conductive pattern 36a includes the current input paths E1 to E3 at positions corresponding respectively to the conducting portions 10a to 10c. Therefore, the inductance of the current path between the conducting portion 10a and the current input portion E1, the inductance of the current path between the conducting portion 10b and the current input portion E2, and the inductance of the current path between the conducting portion 10c and the current input portion E3 are equal.

The conductive pattern 36b includes the slits 40. The current output portion D of the present example is provided in the conductive pattern 36b near the center in the Y-axis direction and at an end portion thereof in the positive X-axis direction. The conductive pattern 36b includes the current output portion D closer to the conducting portion 10b than to the conducting portion 10a and the conducting portion 10c. Therefore, if the slits 40 were not provided, the inductance of the current path between the conducting portion 10b and the current output portion D would be less than the inductance of the current path between the conducting portion 10a and the current output portion D and the inductance of the current path between the conducting portion 10c and the current output portion D.

The slits 40 include two slits, which are the slit 40a and the slit 40b. By combining the slit 40a and the slit 40b, the slits 40 can increase the inductance Lb of the path through which the current Ib flows. In particular, by providing the plurality of slits 40 between the respective current paths of the plurality of conducting portions 10, it is possible to adjust the inductances of the current paths for the currents flowing through the plurality of conducting portions 10 to be equal.

The slit 40a is an L-shaped slit, for example. An end portion of the slit 40a is provided between the current path of the conducting portion 10*a* and the current path of the conducting portion 10*b*. That is, the slit 40*a* is provided extending from an end portion of the conductive pattern 36*b* provided between the conducting portion 10*a* and the conducting portion 10*b* inside the conductive pattern 36*b*. The slit 40*a* of the present example extends inside the conductive pattern 36*b* from the negative side toward the positive side in the X-axis direction and then extends from the positive side toward the negative side in the Y-axis direction, thereby forming an L-shaped slit. The slit 40*a* has two end portions, with one end being open at the end portion of the conductive pattern 36*b*, which is the end portion on the negative X-axis direction side, and the other end portion being closed inside the conductive pattern 36*b*.

The slit 40*b* is an F-shaped slit, for example. An end portion of the slit 40*b* is provided between the current path of the conducting portion 10*b* and the current path of the conducting portion 10*c*. That is, the slit 40*b* is provided extending from an end portion of the conductive pattern 36*b* provided between the current path of the conducting portion 10*b* and the current path of the conducting portion 10*c* inside the conductive pattern 36*b*. The slit 40*b* of the present example extends inside the conductive pattern 36*b*, from the negative side toward the positive side in the X-axis direction. Furthermore, the slit 40*b* includes two slits that extend in a branching manner from the negative side to the positive side in the Y-axis direction. Due to this, the slit 40*b* is F-shaped. The slit 40*b* has three end portions, with one end opening in an end portion of the conductive pattern 36*b*, which is the end portion on the negative X-axis direction side, and the two other ends closing inside the conductive pattern 36*b*. A first other end of the slit 40*b*, the other end of the slit 40*a*, and a second other end of the slit 40*b* are arranged in the stated order in the X-axis direction, between the conducting portions 10*a* to 10*c* and the current output portion D.

By providing the slit 40*a* and the slit 40*b* sandwiching the current path passing through the conducting portion 10*b* in the semiconductor device 100 of the present example, it is possible to increase the inductance Lb. The inductance Lb of the present example may be equal to the inductance La and the inductance Lc. Therefore, the currents Ia to Ic are equal, and the current imbalance is ameliorated. Accordingly, it is possible to improve the reliability of the transistor portion B1 and the diode portion B2 of the semiconductor chip 60 in the semiconductor device 100.

Figure 7B:
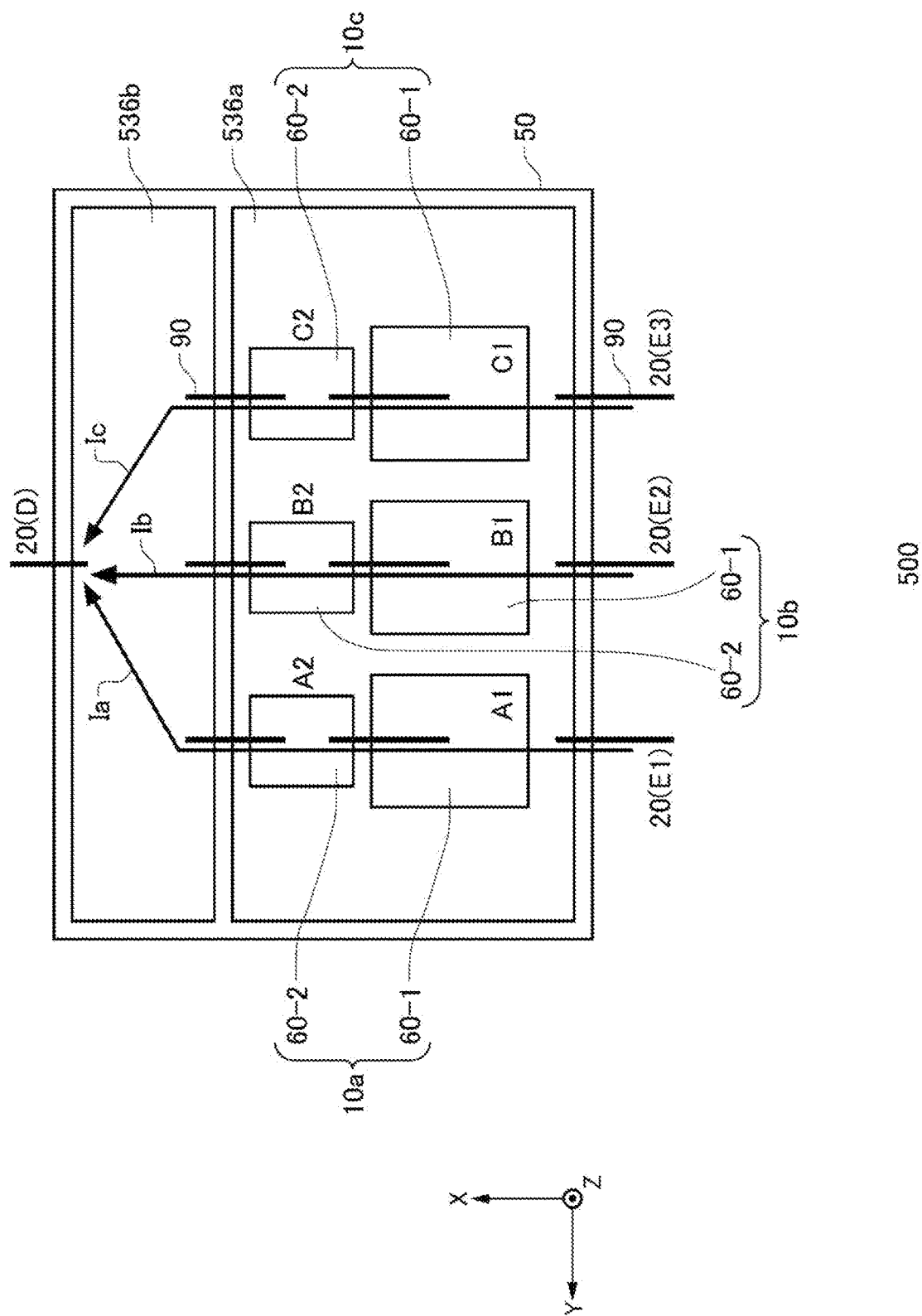
FIG. 7B shows an example of a configuration of the semiconductor device 500 according to a comparative example

FIG. 7B shows an example of a configuration of a semiconductor device 500 according to a comparative example. The semiconductor device 500 of the present example differs from the semiconductor device 100 according to the example shown in FIG. 7A in that the semiconductor device 500 does not include the slits 40 in the conductive patterns 536.

Since the semiconductor device 500 does not include the slits 40, it is impossible to adjust the length of the current path passing through the transistor portion B1 and the diode portion B2. For example, the relationship Lc=La>Lb is established. Therefore, the current Ib is larger than the current Ia and the current Ic. Accordingly, the heat generation of the transistor portion B1 is greater than the heat generation of the transistor portion A1 and the transistor portion C1. Furthermore, the heat generation of the diode portion B2 is greater than the heat generation of the diode portion A2 and the diode portion C2. Due to this, the transistor portion B1 and the diode portion B2 have shortened lifetimes and are likely to break down.

Figure 8A:
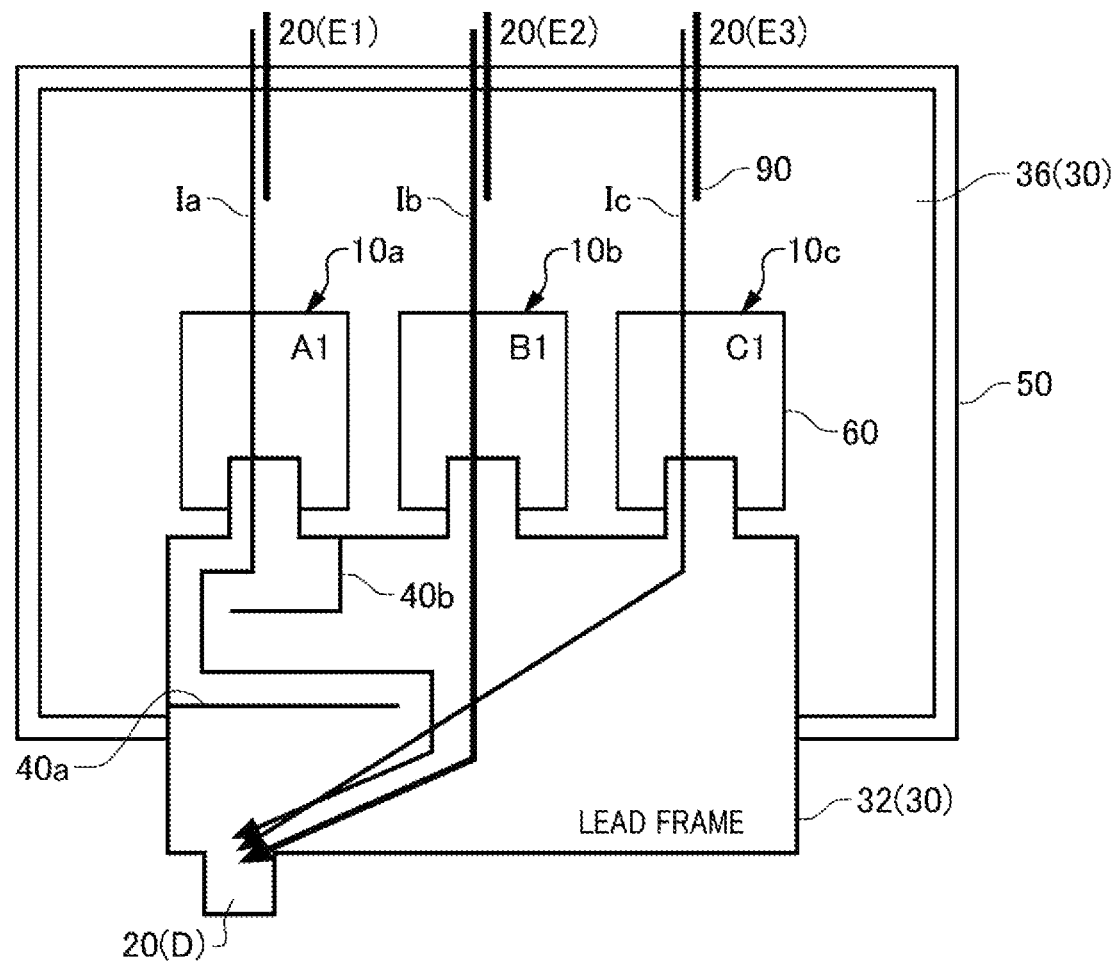
FIG. 8A shows an example of a configuration of the semiconductor device 100 according to an example.
Figure 8A:
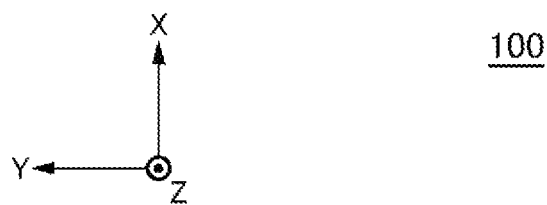

FIG. 8A shows an example of a configuration of a semiconductor device 100 according to an example. The semiconductor device 100 of the present example includes a lead frame 32. In the present example, the current path portion 30 is the lead frame 32.

The three conducting portions 10*a* to 10*c* each include a semiconductor chip 60. The three conducting portions 10*a* to 10*c* are provided in the stated order from the positive side to the negative side in the Y-axis direction. The three conducting portions 10*a* to 10*c* are arranged at uniform intervals, but may instead be arranged at differing intervals. The three conducting portions 10*a* to 10*c* are not limited to being arranged in the Y-axis direction, and may be arranged in any direction in the XY-plane.

The conductive pattern 36 includes the current input portions E1 to E3 at positions corresponding respectively to the conducting portions 10*a* to 10*c*. Therefore, the inductance of the current path between the conducting portion 10*a* and the current input portion E1, the inductance of the current path between the conducting portion 10*b* and the current input portion E2, and the inductance of the current path between the conducting portion 10*c* and the current input portion E3 are equal. The current input portions E1 to E3 of the present example are provided at an end of the conductive pattern 36 on the positive X-axis direction side. Furthermore, the current input portions E1 to E3 are provided in the stated order from the positive side toward the negative side in the Y-axis direction.

The lead frame 32 is provided between the semiconductor chip 60 and the current output portion D. The lead frame 32 electrically connects the semiconductor chip 60 and the current output portion D. The lead frame 32 includes slits 40. The lead frame 32 is electrically connected to the semiconductor chip 60, on the negative X-axis direction side of the semiconductor chip 60. The current output portion D of the present example is provided at an end portion of the lead frame 32 on the negative X-axis direction side. Furthermore, the current output portion D is provided farther on the positive Y-axis direction side than the conducting portion 10*a*.

The slits 40 include a slit 40*a* and a slit 40*b*. By combining the slit 40*a* and the slit 40*b*, the slits 40 can increase the inductance La of the path through which the current Ia flows.

The slit 40*a* is an I-shaped slit, for example. An end portion of the slit 40*a* is provided between the current output portion D and the current path of the conducting portion 10*a*. Essentially, the slit 40*a* is provided extending inside the lead frame 32 from an end portion of the lead frame 32 provided between the current output portion D and the conducting portion 10*a*. The slit 40*a* of the present example is an I-shaped slit that extends inside the lead frame 32 from the positive side toward the negative side in the Y-axis direction.

The slit 40*b* is an L-shaped slit, for example. An end portion of the slit 40*b* is provided between the current path of the conducting portion 10*a* and the current path of the conducting portion 10*b*. Essentially, the slit 40*b* is provided extending inside the lead frame 32 from an end portion of the lead frame 32 provided between the current path of the conducting portion 10*a* and the current path of the conducting portion 10*b* toward the current output portion D. The slit 40*b* of the present example extends inside the lead frame 32 from the positive side toward the negative side in the X-axis direction and then extends from the negative side toward the positive side in the Y-axis direction, thereby forming an L-shaped slit.

By providing the slits 40 in the semiconductor device 100 of the present example, the inductance La is increased. The inductance La of the present example may be equal to the inductance Lc. Therefore, the current Ia and the current Ic are equal, and the current imbalance is ameliorated. Accordingly, it is possible to improve the reliability of the transistor portion A1 of the semiconductor chip 60 in the semiconductor device 100. However, it should be noted that the current Ib of the present example may be larger than the current Ia and the current Ic.

Figure 8B:
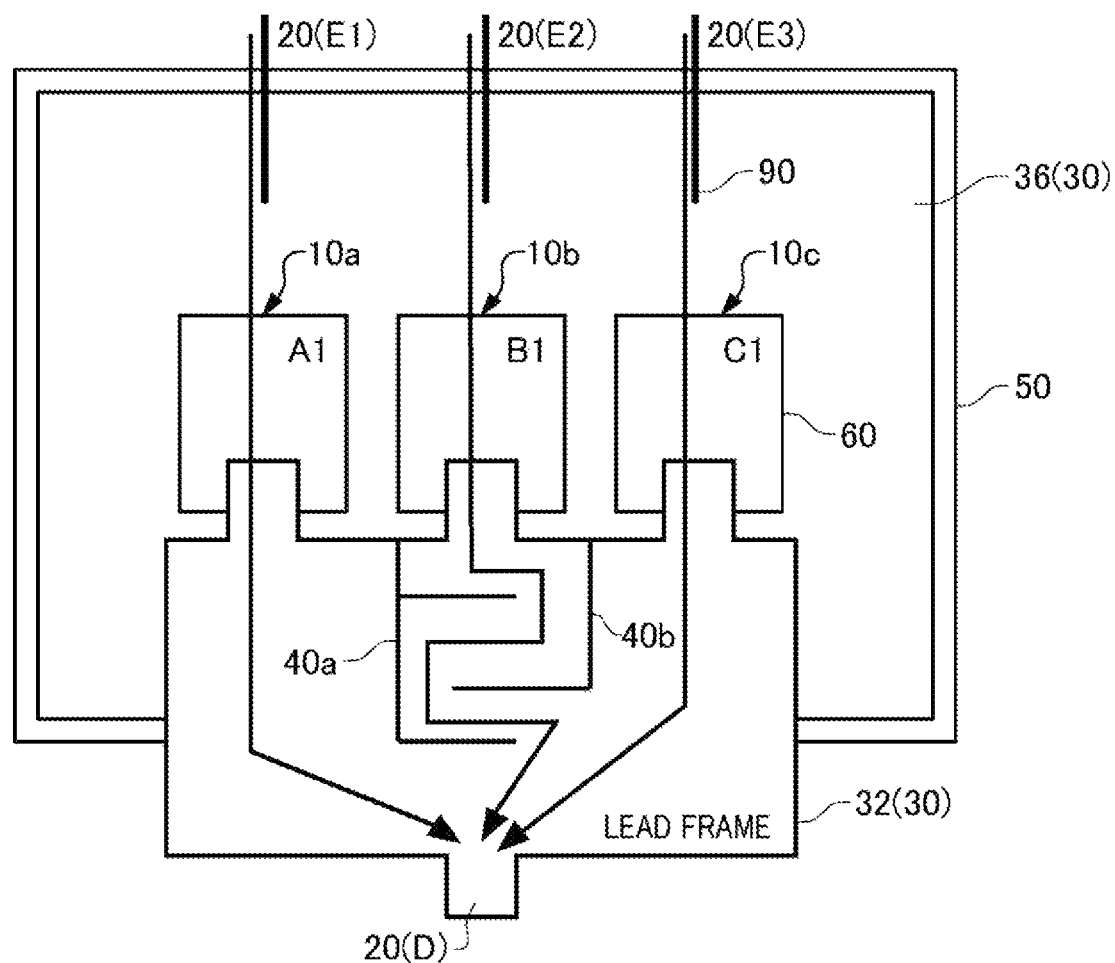
FIG. 8B shows an example of a configuration of the semiconductor device 100 according to an example.

FIG. 8B shows an example of a configuration of a semiconductor device 100 according to an example. The pattern of the slits 40 provided in the lead frame 32 of the semiconductor device 100 of the present example differs from the pattern in the example of FIG. 8A. In the present example, the description focuses on points different from those of FIG. 8A.

The lead frame 32 includes slits 40. The lead frame 32 includes the current output portion D closer to the conducting portion 10b than to the conducting portion 10a and the conducting portion 10c. Therefore, if the slits 40 were not provided, the inductance of the current path between the conducting portion 10b and the current output portion D would be less than the inductance of the current path between the conducting portion 10a and the current output portion D and the inductance of the current path between the conducting portion 10c and the current output portion D.

The slits 40 include the slit 40a and the slit 40b. By combining the slit 40a and the slit 40b, the slits 40 can increase the inductance Lb of the path through which the current Ib flows.

The slit 40a is an F-shaped slit, for example. An end portion of the slit 40a is provided between the current path of the conducting portion 10a and the current path of the conducting portion 10b. Essentially, the slit 40a is provided extending inside the lead frame 32 from an end portion of the lead frame 32 provided between the conducting portion 10a and the conducting portion 10b. The slit 40a of the present example extends inside the lead frame 32 from the positive side to the negative side in the X-axis direction. Furthermore, the slit 40a includes two slits that branch and extend from the positive side toward the negative side in the Y-axis direction. Therefore, the slit 40a forms an F shape.

The slit 40b is an L-shaped slit, for example. An end portion of the slit 40b is provided between the current path of the conducting portion 10a and the current path of the conducting portion 10b. Essentially, the slit 40b is provided extending inside the lead frame 32 from an end portion of the lead frame 32 provided between the current path of the conducting portion 10b and the current path of the conducting portion 10c toward the current output portion D. The slit 40b of the present example extends inside the lead frame 32 from the positive side toward the negative side in the X-axis direction and then extends from the negative side toward the positive side in the Y-axis direction, thereby forming an L-shaped slit.

By providing the slits 40 in the semiconductor device 100 of the present example, the inductance Lb can be increased. The inductance Lb of the present example may be equal to the inductance La and the inductance Lc. Therefore, the currents Ia to Ic are equal, and the current imbalance is ameliorated. Accordingly, it is possible to improve the reliability of the transistor portion B1 of the semiconductor chip 60 in the semiconductor device 100.

Figure 8C:
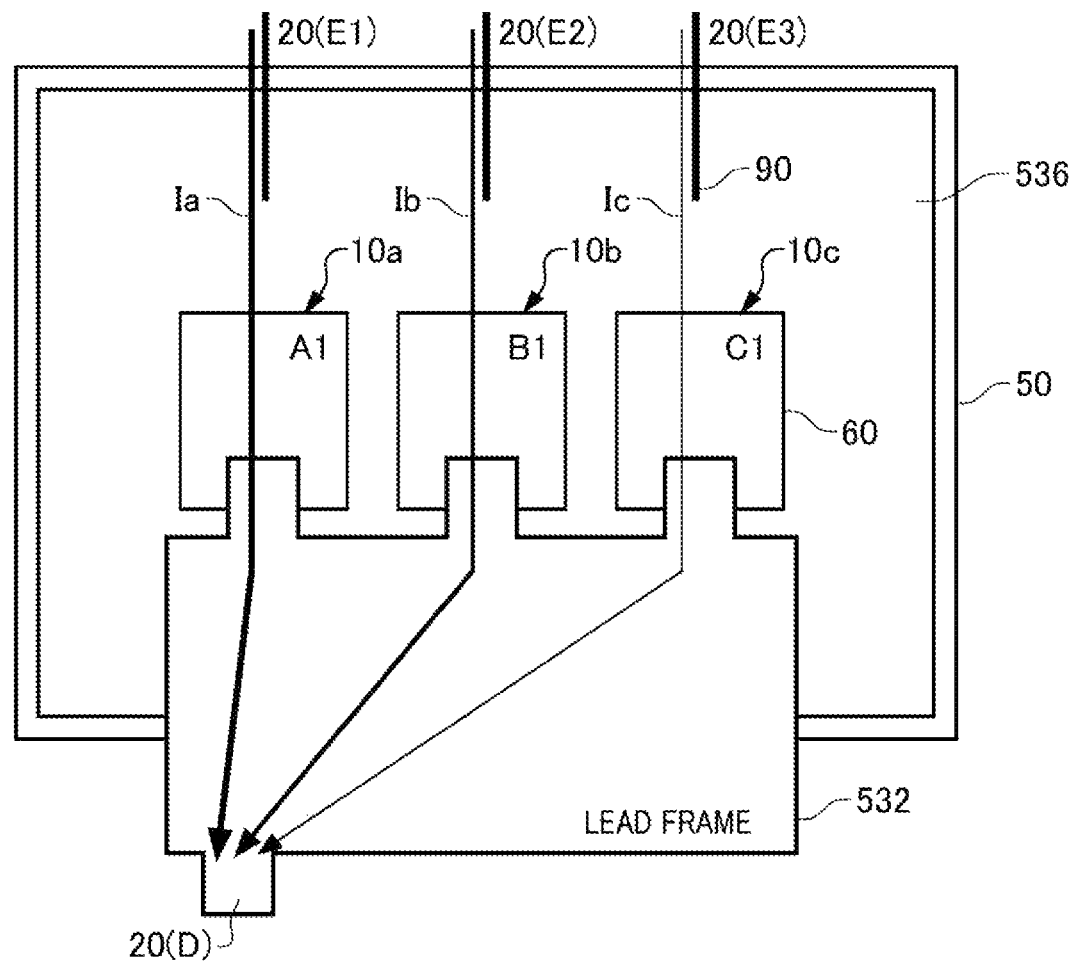
FIG. 8C shows an example of a configuration of the semiconductor device 500 according to a comparative example
Figure 8C:
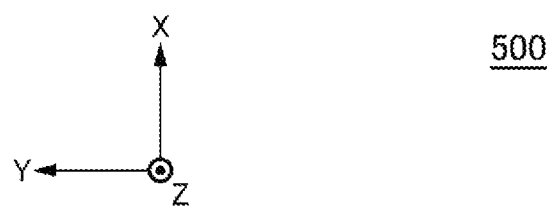

FIG. 8C shows an example of a configuration of a semiconductor device 500 according to a comparative example. The semiconductor device 500 of the present example differs from the semiconductor device 100 according to the example of FIGS. 8A and 8B in that the semiconductor device 500 does not include the slits 40 in the lead frame 532.

Since the semiconductor device 500 does not include the slits 40, it is impossible to adjust the length of the current path passing through the transistor portion A1. For example, a relationship of Lc>Lb>La is established. Therefore, the current Ia is larger than the current Ib, and the current Ib is larger than the current Ic. Accordingly, the heat generation of the transistor portion A1 is greater than the heat generation of the transistor portion B1 and the transistor portion C1. Due to this, the transistor portion A1 has a shortened lifetime and is likely to break down.

Figure 9A:
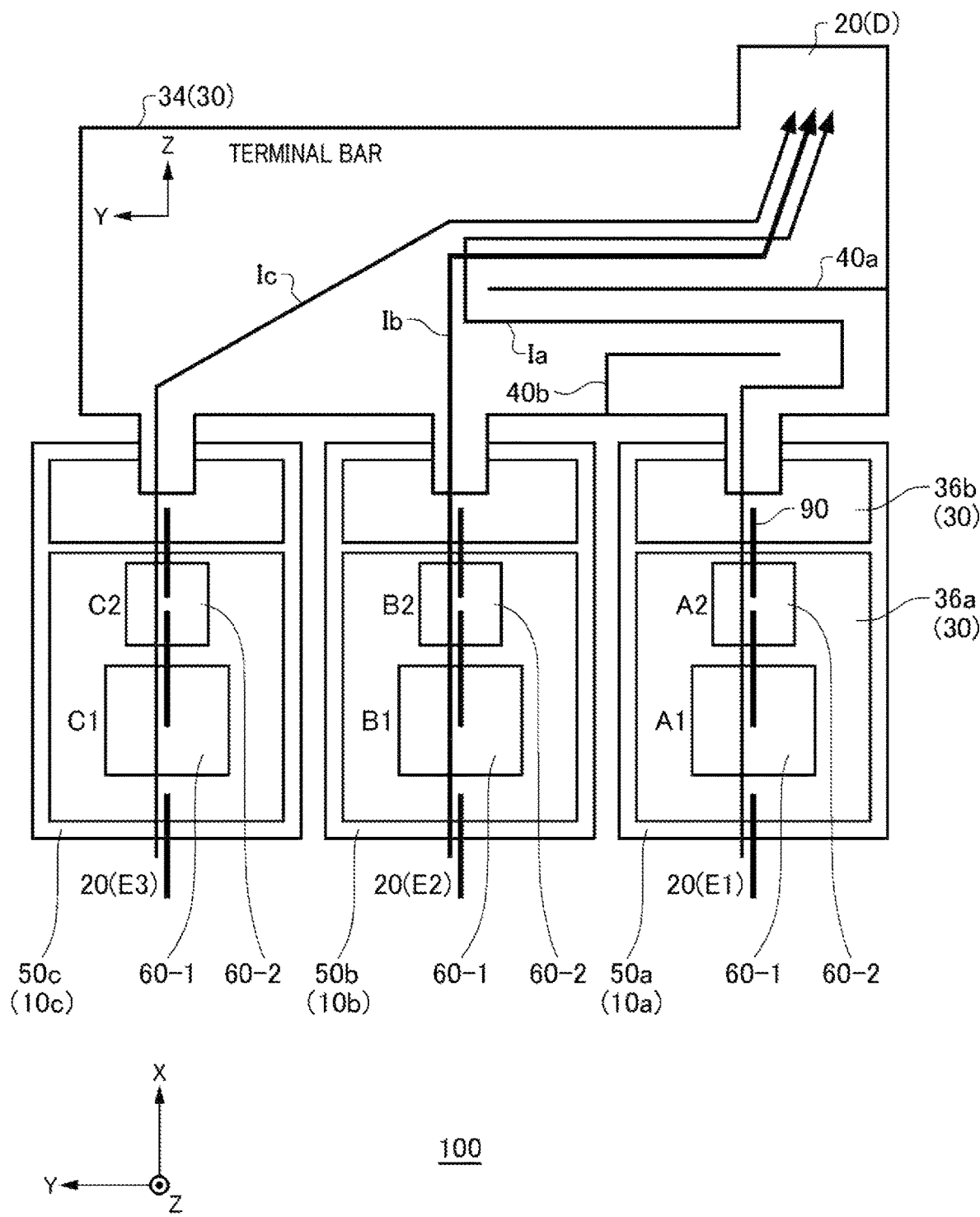
FIG. 9A shows an example of a configuration of the semiconductor device 100 according to an example.

FIG. 9A shows an example of a configuration of a semiconductor device 100 according to an example. The semiconductor device 100 of the present example includes a terminal bar 34. In the present example, the current path portion 30 is the terminal bar 34 and the conductive pattern 36. Furthermore, the conducting portion 10 of the present example is an insulating substrate 50. In order to make it easier to understand the current path, FIG. 9A is a view expanded in a single planar view, but actually, the insulating substrate 50 and the terminal bar 34 may be provided in different planes. For example, the terminal bar 34 is provided in a direction perpendicular to the insulating substrate 50 provided in the XY-plane. In other words, the terminal bar 34 of the present example has a main surface in the ZY-plane.

The conducting portions 10a to 10c respectively include the insulating substrates 50a to 50c. Essentially, due to the slits 40, the semiconductor device 100 of the present example eliminates the imbalance of the currents Ia to Ic flowing through the insulating substrates 50a to 50c.

In the present example, the three conducting portions 10a to 10c are provided in the stated order from the negative side toward the positive side in the Y-axis direction. The three conducting portions 10a to 10c are arranged at uniform intervals, but may instead be arranged at differing intervals. The three conducting portions 10a to 10c are not limited to being arranged in the Y-axis direction, and may be arranged in any direction in the XY-plane.

The insulating substrates 50a to 50c each include the conductive pattern 36a and the conductive pattern 36b. The conductive pattern 36a does not need to include a slit 40. The conductive patterns 36a of the insulating substrates 50a to 50c include current input portions E1 to E3 at positions corresponding respectively to the conducting portions 10a to 10c. Therefore, the inductance of the current path between the conducting portion 10a and the current input path E1, the inductance of the current path between the conducting portion 10b and the current input path E2, and the inductance of the current path between the conducting portion 10c and the current input path E3 are equal. The conductive pattern 36b of the present example is provided adjacent to the conductive pattern 36a on the positive X-axis direction side.

The current input portions E1 to E3 of the present example are provided to the end portions of the conductive patterns 36a of the insulating substrates 50a to 50c on the negative X-axis direction side. Furthermore, the current input portions E1 to E3 of the present example are provided in the stated order from the negative side to the positive side in the Y-axis direction.

The terminal bar 34 is provided between the insulating substrate 50 and the current output portion D. The terminal bar 34 electrically connects the insulating substrates 50 and the current output portion D. The current output portion D of the present example functions as an external terminal connecting to the outside of the semiconductor device 100. The terminal bar 34 electrically connects the semiconductor chips 60 and the external terminal. The terminal bar 34 includes the current output portion D closer to the conducting portion 10a than to the conducting portion 10b and the conducting portion 10c. The current output portion D of the present example is provided at an end portion of the terminal bar 34 on the positive Z-axis direction side. Furthermore, the current output portion D is provided at an end portion of the terminal bar 34 on the negative Y-axis direction side. The current output portion D may be provided bending in the X-axis direction, as shown in FIG. 1.

The slits 40 are provided in the terminal bar 34. The slits 40 include the slit 40a and the slit 40b. By combining the slit 40a and the slit 40b, the slits 40 can increase the inductance La of the path through which the current Ia flows.

The slit 40a is an I-shaped slit, for example. An end portion of the slit 40a is provided between the current output portion D and the current path of the conducting portion 10a. Essentially, the slit 40a is provided extending inside the terminal bar 34 from an end portion of the terminal bar 34 provided between the current output portion D and the conducting portion 10a in a direction away from the current output portion D. The slit 40a of the present example is an I-shaped slit that extends inside the terminal bar 34 from the negative side toward the positive side in the Y-axis direction. The slit 40a has two end portions, with one end opening at an end portion of the terminal bar 34, which is the end portion on the negative Y-axis direction side, and the other end being closed inside the terminal bar 34.

The slit 40b is an L-shaped slit, for example. An end portion of the slit 40b is provided between the current path of the conducting portion 10a and the current path of the conducting portion 10b. That is, the slit 40b is provided extending inside the terminal bar 34 from an end portion of the terminal bar 34 provided between the current path of the conducting portion 10a and the current path of the conducting portion 10b. The slit 40b of the present example extends inside the terminal bar 34 from the negative side toward the positive side in the Z-axis direction and then extends from the positive side toward the negative side in the Y-axis direction, thereby forming an L-shaped slit. The slit 40b has two end portions, with one end opening at an end portion of the terminal bar 34, which is the end portion on the negative Z-axis direction side, and the other end being closed inside the terminal bar 34. The slit 40b is arranged between the slit 40a and the conducting portions 10a and 10b, in the top plan view.

By providing the slits 40 in the semiconductor device 100 of the present example, the inductance La can be increased. The inductance La of the present example may be equal to the inductance Lc. Therefore, the current Ia and the current Ic are equal, and the current imbalance is ameliorated. Accordingly, it is possible to improve the reliability of the transistor portion A1 and the diode portion A2 of the semiconductor chip 60 in the semiconductor device 100. It should be noted that the current Ib of the present example may be larger than the current Ia and the current Ic.

Figure 9B:
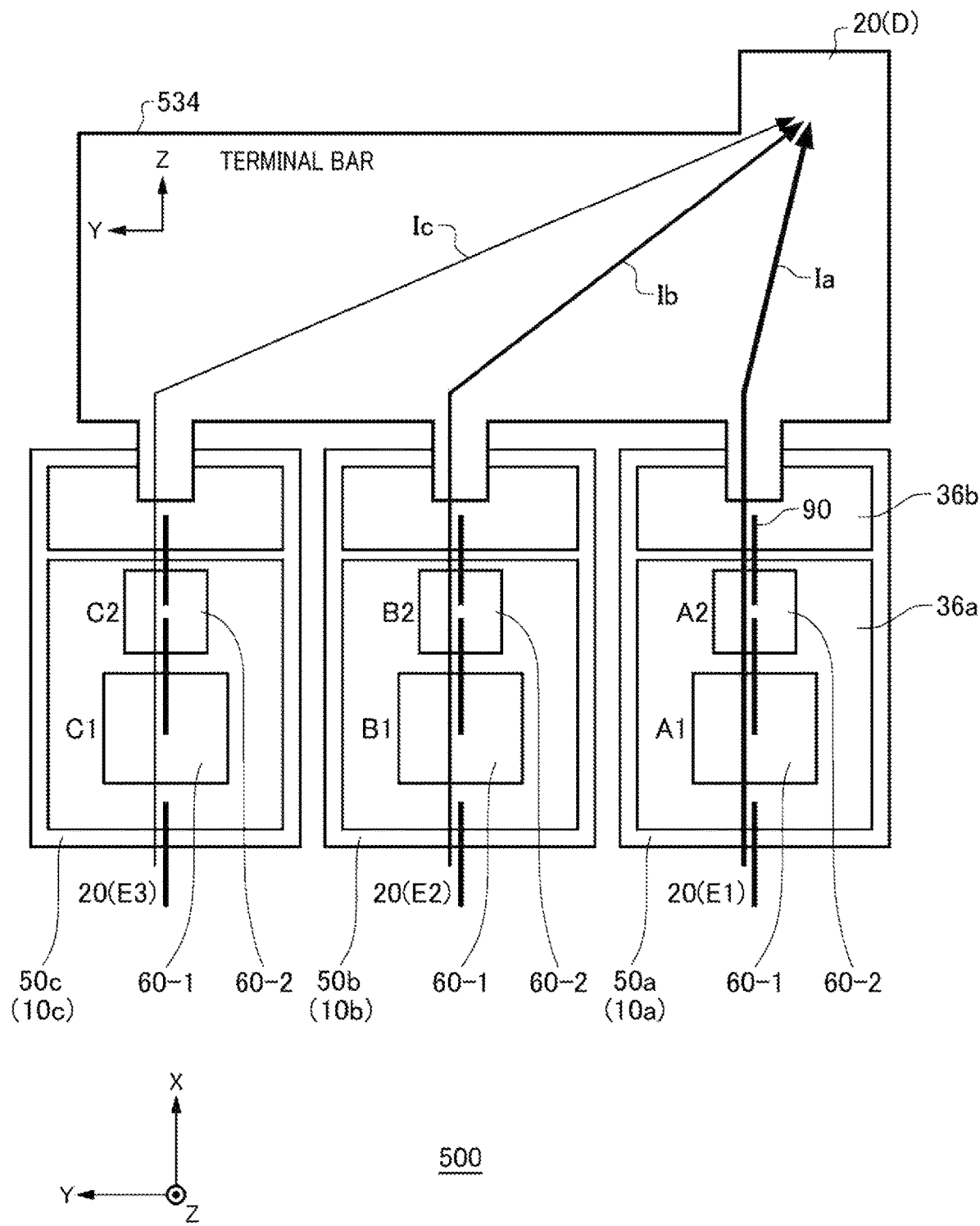
FIG. 9B shows an example of a configuration of the semiconductor device 500 according to a comparative example

FIG. 9B shows an example of a configuration of a semiconductor device 500 according to a comparative example. The semiconductor device 500 of the present example differs from the semiconductor device 100 according to the example of FIG. 9A in that the semiconductor device 500 does not include a slit 40 in the terminal bar 534.

Since the semiconductor device 500 does not include a slit 40, it is impossible to adjust the length of the current path passing through the transistor portion A1 and the diode portion A2. For example, a relationship of Lc>Lb>La is established. Therefore, the current Ia is larger than the current Ib, and the current Ib is larger than the current Ic. Accordingly, the heat generation of the transistor portion A1 is greater than the heat generation of the transistor portion B1 and the transistor portion C1. Furthermore, the heat generation of the diode portion A2 is greater than the heat generation of the diode portion B2 and the transistor portion C2. Due to this, the transistor portion A1 and the diode portion A2 have shortened lifetimes and are likely to break down.

Figure 10A:
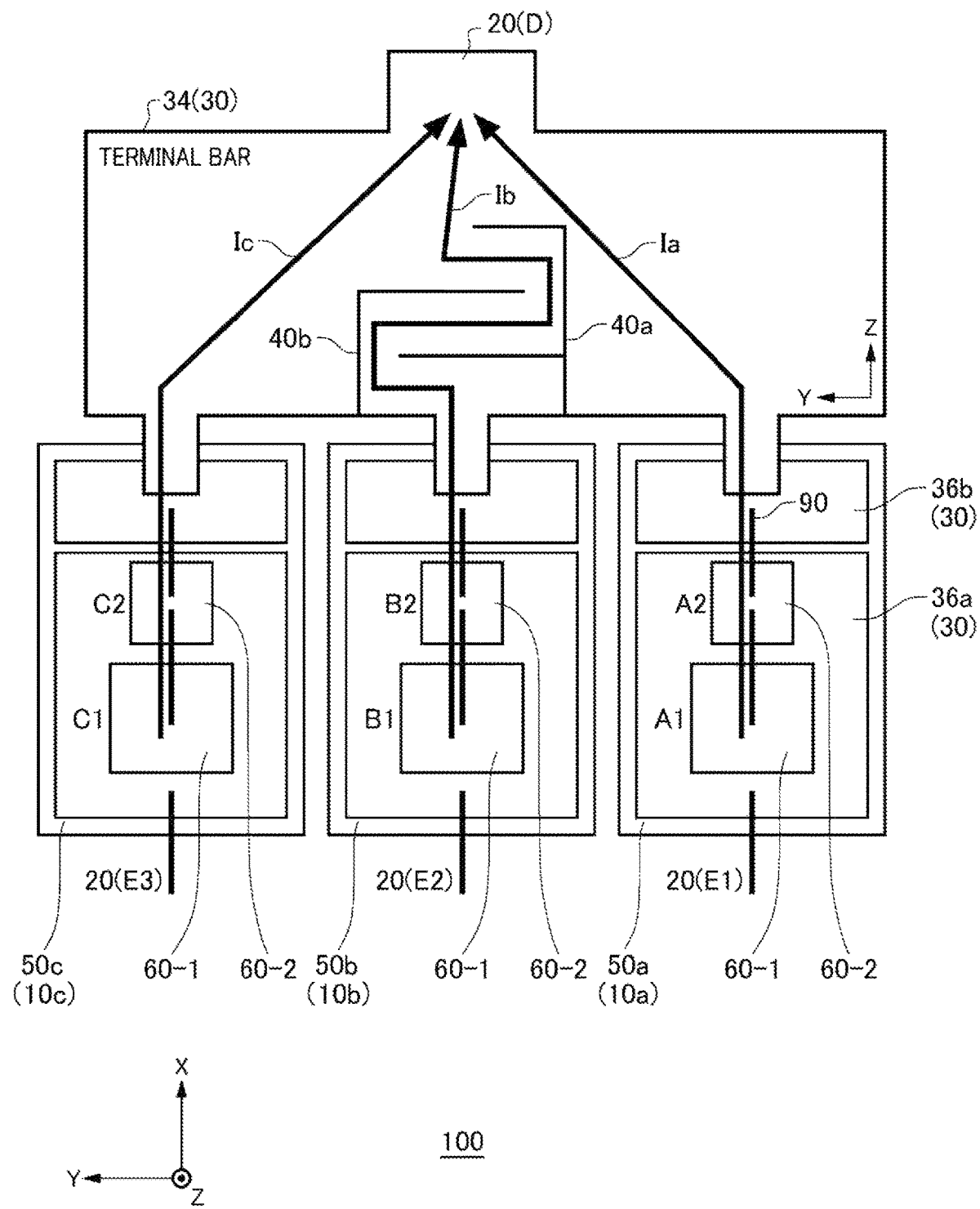
FIG. 10A shows an example of a configuration of the semiconductor device 100 according to an example.

FIG. 10A shows an example of a configuration of a semiconductor device 100 according to an example. The semiconductor device 100 of the present example includes the terminal bar 34. The semiconductor device 100 of the present example has the current output portion D of the current input/output portion 20 provided at a different position than in the case of FIG. 9A. In the present example, the description focuses on points differing from those of FIG. 9A.

The terminal bar 34 is provided between the insulating substrate 50 and the current output portion D. The terminal bar 34 electrically connects the insulating substrates 50 and the current output portion D. The current output portion D of the present example is provided in the terminal bar 34 near the center in the Y-axis direction and at an end portion thereof in the positive Z-axis direction. The terminal bar 34 includes the current output portion D closer to the conducting portion 10b than to the conducting portion 10a and the conducting portion 10c. Therefore, if the slits 40 were not provided, the inductance of the current path between the conducting portion 10b and the current output portion D would be less than the inductance of the current path between the conducting portion 10a and the current output portion D and the inductance of the current path between the conducting portion 10c and the current output portion D.

The terminal bar 34 is provided with slits 40. The slits 40 include the slit 40a and the slit 40b. By combining the slit 40a and the slit 40b, the slits 40 can increase the inductance Lb of the path through which the current Ib flows.

The slit 40a is an F-shaped slit, for example. An end portion of the slit 40a is provided between the current output portion D and the current path of the conducting portion 10b. Essentially, the slit 40a is provided extending inside the terminal bar 34 from an end portion of the terminal bar 34 provided between the conducting portion 10a and the conducting portion 10b. The slit 40a of the present example extends inside the terminal bar 34 from the negative side to the positive side in the Z-axis direction. Furthermore, the slit 40a includes two slits that branch and extend from the negative side toward the positive side in the Y-axis direction. Therefore, the slit 40a forms an F shape. The slit 40a has three end portions, with one end opening in an end portion of the terminal bar 34, which is the end portion on the negative Z-axis direction side, and the other two end portions being closed inside the terminal bar 34. A first other end of the slit 40a, the other end of the slit 40b, and the second other end of the slit 40a are arranged in the stated order in the Z-axis direction, between the conducting portions 10a to 10c and the current output portion D.

The slit 40b is an L-shaped slit, for example. An end portion of the slit 40b is provided between the current path of the conducting portion 10b and the current path of the conducting portion 10c. Essentially, the slit 40b is provided extending inside the terminal bar 34 from an end portion of the terminal bar 34 provided between the current path of the conducting portion 10b and the current path of the conducting portion 10c. The slit 40b of the present example extends inside the terminal bar 34 from the negative side toward the positive side in the Z-axis direction and then extends from the positive side toward the negative side in the Y-axis direction, thereby forming an L-shaped slit. The slit 40b has two end portions, with one end opening in an end portion of the terminal bar 34, which is the end portion on the negative Z-axis direction side, and the other end being closed inside the terminal bar 34.

By providing the slits 40 in the semiconductor device 100 of the present example, the inductance Lb can be increased. The inductance Lb of the present example may be equal to the inductance La and the inductance Lc. Therefore, the currents Ia to Ic are equal, and the current imbalance is ameliorated. Accordingly, it is possible to improve the reliability of the transistor portion B1 and the diode portion B2 of the insulating substrate 50 in the semiconductor device 100.

Figure 10B:
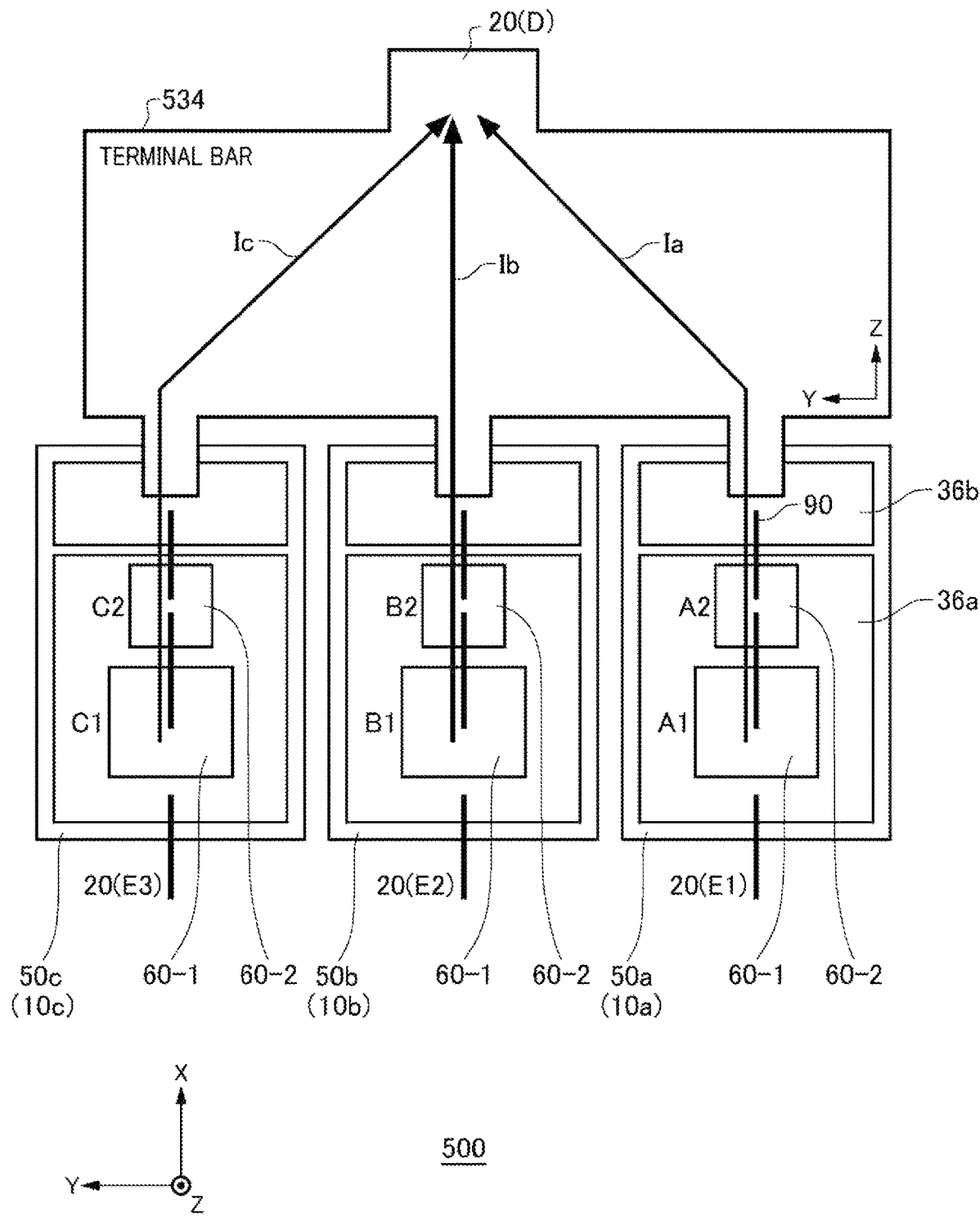
FIG. 10B shows an example of a configuration of the semiconductor device 500 according to a comparative example

FIG. 10B shows an example of a configuration of a semiconductor device 500 according to a comparative example. The semiconductor device 500 of the present example differs from the semiconductor device 100 according to the example of FIG. 10A in that the semiconductor device 500 does not include a slit 40 in the terminal bar 534.

Since the semiconductor device 500 does not include the slit 40, it is impossible to adjust the length of the current path passing through the transistor portion B1 and the diode portion B2. For example, the relationship Lc=La>Lb is established. Therefore, the current Ib is larger than the current Ia and the current Ic. Accordingly, the heat generation of the transistor portion B1 is greater than the heat generation of the transistor portion A1 and the transistor portion C1. Furthermore, the heat generation of the diode portion B2 is greater than the heat generation of the diode portion A2 and the diode portion C2. Due to this, the transistor portion B1 and the diode portion B2 have shortened lifetimes and are likely to break down.

Figure 11A:
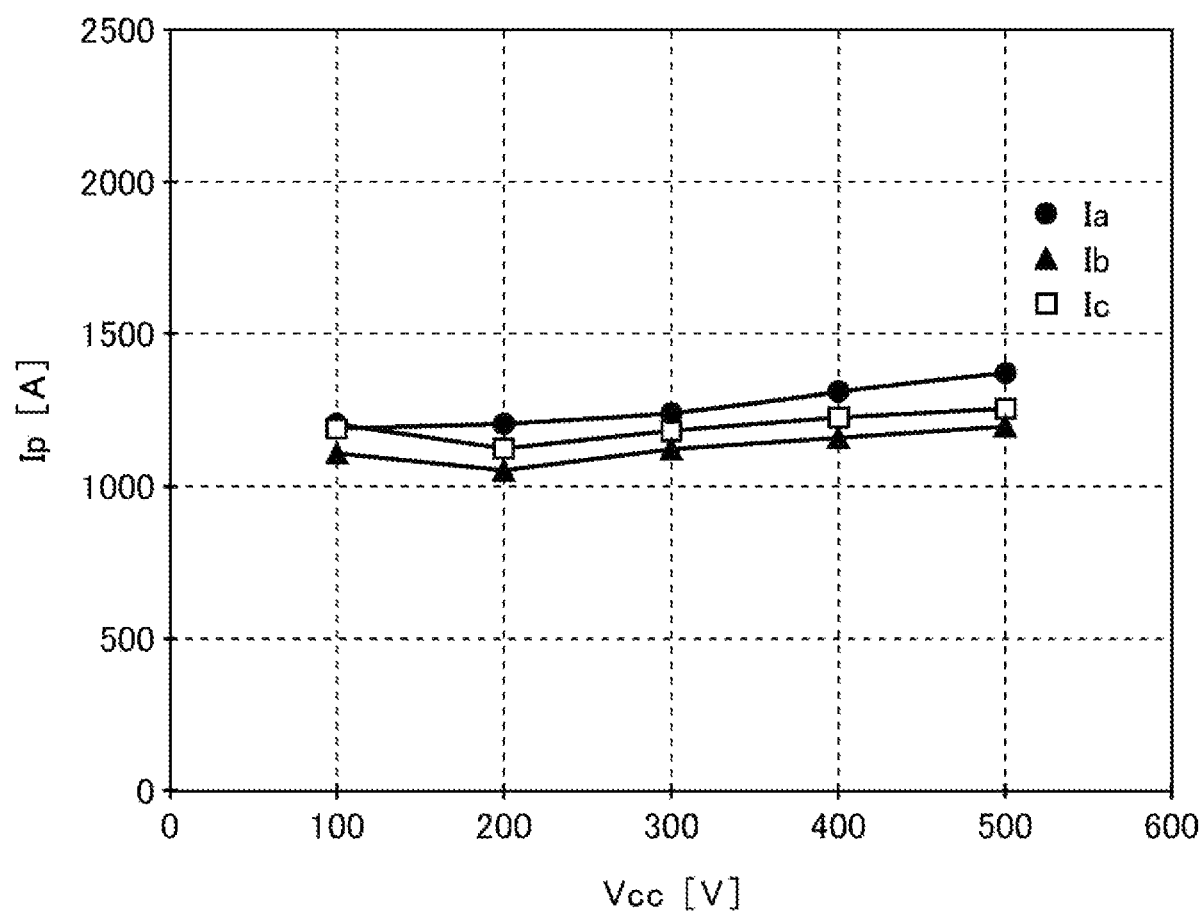
FIG. 11A shows an example of a current peak characteristic of the semiconductor device 100 according to the example of FIG. 9A.

FIG. 11A shows an example of a current peak characteristic of the semiconductor device 100 according to the example of FIG. 9A. The vertical axis indicates the peak Ip [A] of the current, and the horizontal axis indicates the power supply voltage Vcc [V]. The black circles indicate the peak of the current Ia. The squares indicate the peak of the current Ic. The triangles indicate the peak of the current Ib.

The currents Ia to Ic correspond respectively to the currents flowing through the conducting portions 10a to 10c. In the present example, the currents Ia to Ic are made to have uniform current peak values, by adjusting the inductance of the current path portion 30. In other words, the current imbalance is eliminated.

Figure 11B:
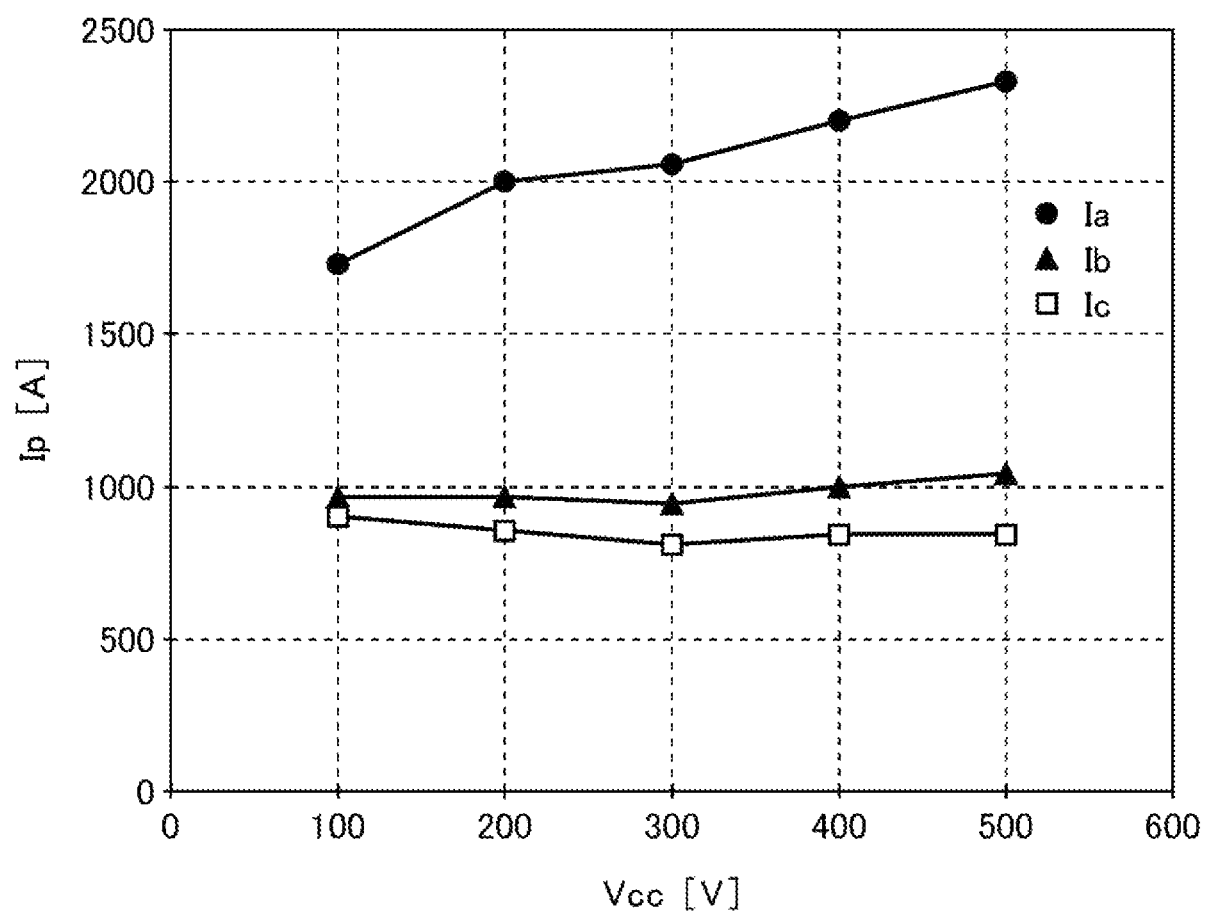
FIG. 11B shows an example of a current peak characteristic of the semiconductor device 500 according to the comparative example of FIG. 9B.

FIG. 11B shows an example of a current peak characteristic of the semiconductor device 500 according to the comparative example of FIG. 9B. The vertical axis indicates the peak Ip [A] of the current, and the horizontal axis indicates the power supply voltage Vcc [V]. The black circles indicate the peak of the current Ia. The squares indicate the peak of the current Ic. The triangles indicate the peak of the current Ib.

The current Ia has a current peak Ip that is larger than that of the current Ib and the current Ic. Essentially, in the semiconductor device 500, the inductance La is less than the inductance Lb and the inductance Lc, and therefore the current peak of the current Ia cannot be suppressed. Due to this, the conducting portion 10a is likely to break down.

Figure 12:
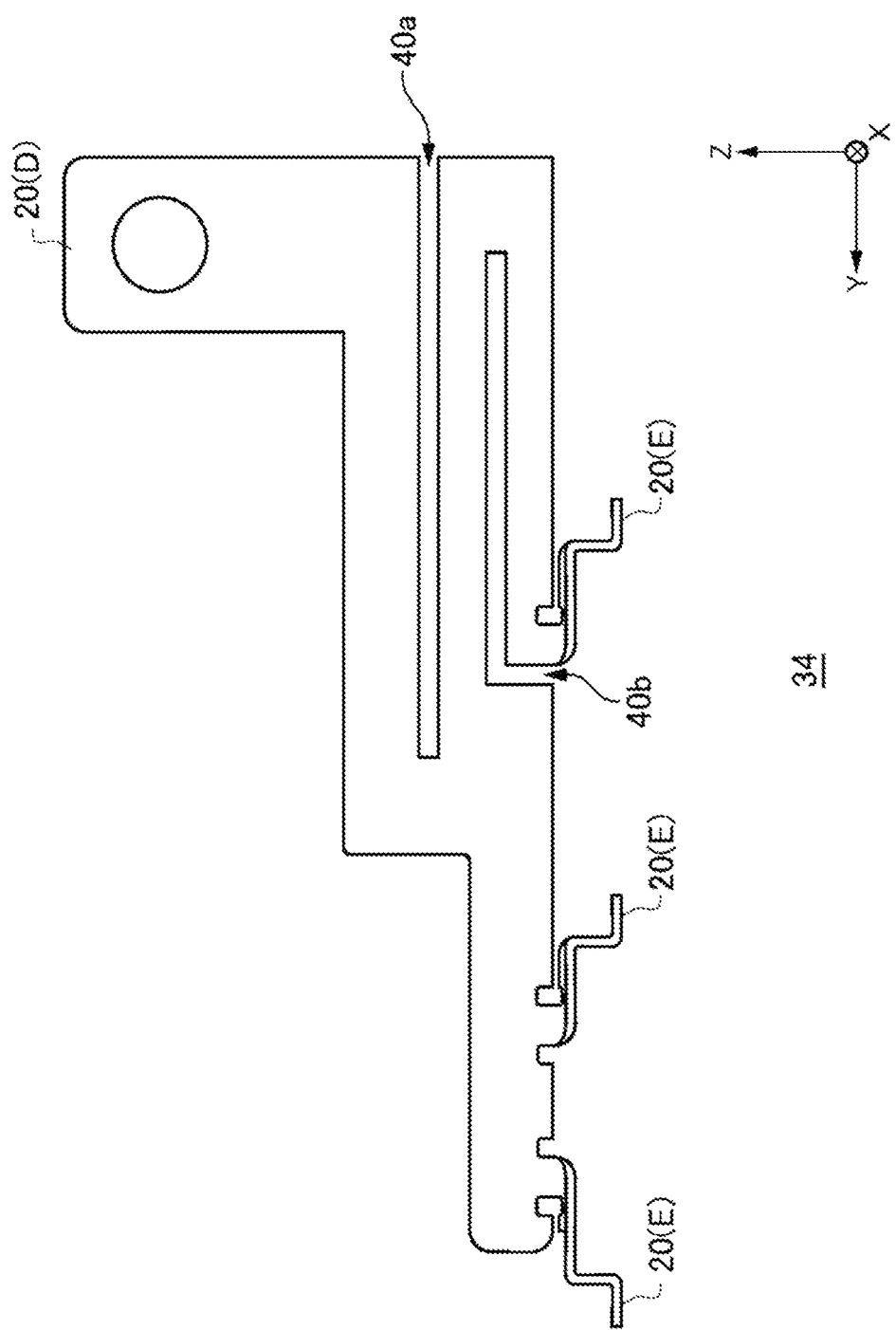
FIG. 12 shows an example of a configuration of a terminal bar 34.

FIG. 12 shows an example of a configuration of the terminal bar 34. The terminal bar 34 of the present example may be used as the N terminal.

The terminal bar 34 includes a plurality of slits 40. The terminal bar 34 of the present example is an example of a current path portion 30 in which the inductance of a current path in which current is conducted through a conducting portion 10 is adjusted by the plurality of slits 40. Furthermore, the terminal bar 34 includes a plurality of current input portions E and one current output portion D, as the current input/output portion 20. The terminal bar 34 of the present example includes three current input portions E, but is not limited to this. The three current input portions E are an example of the current input/output portion 20, and are electrically connected to the conducting portion 10.

The slit 40a is I-shaped. The slit 40a of the present example extends inside the terminal bar 34 from the negative side toward the positive side in the Y-axis direction, to form an I-shaped slit. The slit 40b is L-shaped. The slit 40b of the present example extends inside the terminal bar 34 from the negative side toward the positive side in the Z-axis direction and then extends from the positive side to the negative side in the Y-axis direction, to form an L-shaped slit. The three leg portions (current input portions E) of the terminal bar 34 may be connected to the insulating substrate 50 and the lead frame 32, using ultrasonic waves or solder. The slit 40a has two end portions, with one end opening in an end portion of the terminal bar 34, which is the end portion on the negative Y-axis direction side, and the other end being closed inside the terminal bar 34. The slit 40b has two end portions, with one end opening in an end portion of the terminal bar 34, which is the end portion on the negative Z-axis direction side, and the other end being closed inside the terminal bar 34. The one end of the slit 40b may be arranged between a first leg portion and a second leg portion, in order from the current output portion D, among the three leg portions. As shown in the drawings, the width of the terminal bar 34, in the Z-axis direction, across which the first leg portion is arranged may be greater than the width of the terminal bar 34, in the Z-axis direction, across which the second leg portion and the third leg portion are arranged.

For example, the terminal bar 34 is electrically connected to one of the external connection terminals among the first external connection terminal tm1 to the fifth external connection terminal tm5 shown in FIG. 2. In this case, each current output portion D functions as one of the external connection terminals among the first external connection terminal tm1 to the fifth external connection terminal tm5. In the present example, the terminal bar 34 is used as the N terminal, and therefore the current output portion D functions as the fourth external connection terminal tm4 (N). The current output portion D of the present example is provided to the terminal bar 34 at an end portion on the negative Y-axis direction side and on the positive Z-axis direction side. However, the position of the current output portion D is not limited to this, as long as the current output portion D is at a position that does not cause interference with any of the positive terminal P, the middle terminals M, the negative terminal N, and the AC output terminal.

Figure 13:
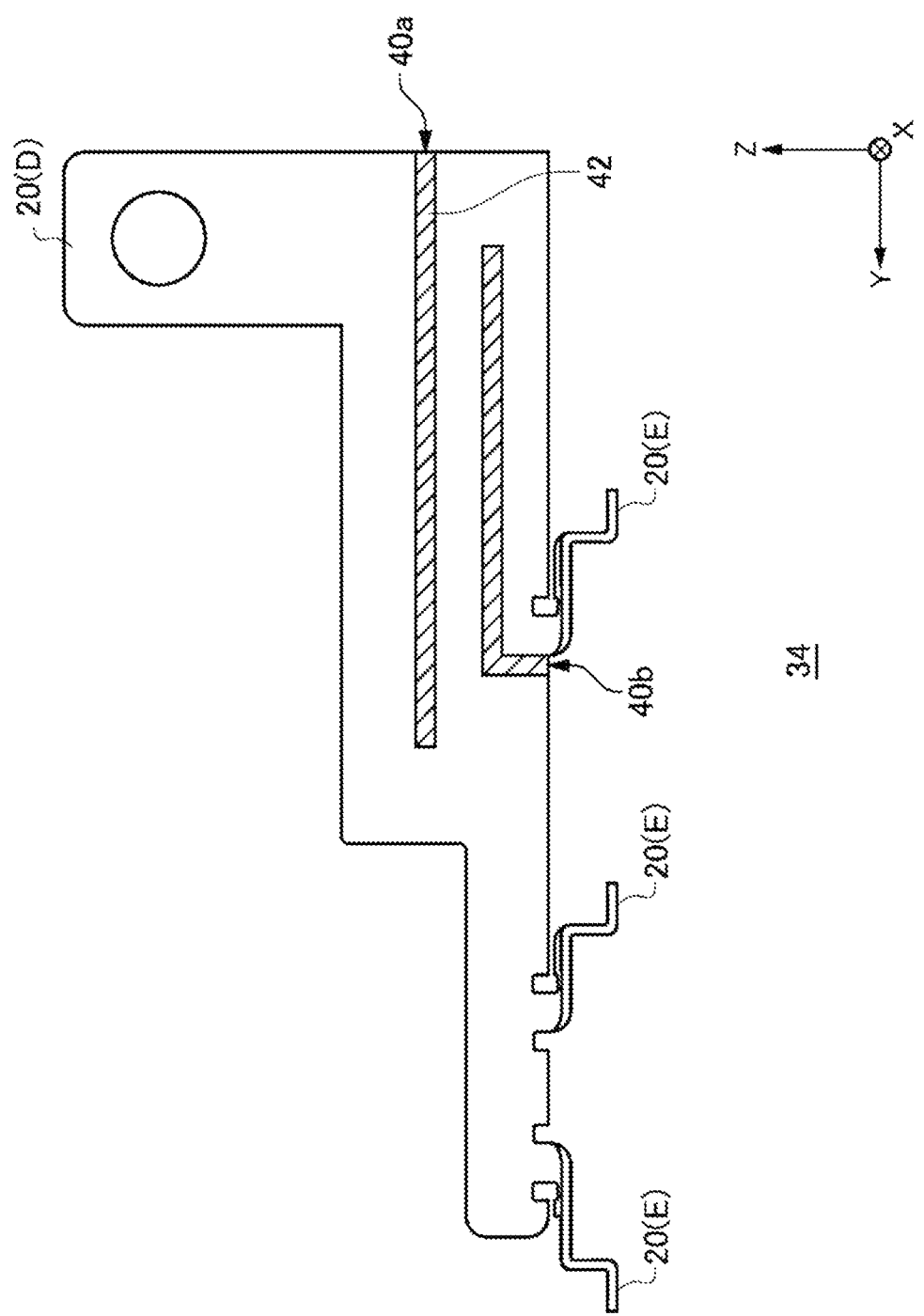
FIG. 13 shows an example of the terminal bar 34 including a vibration absorbing member 42.

FIG. 13 shows an example of the terminal bar 34 including a vibration absorbing member 42. The terminal bar 34 of the present example may be used as the N terminal. The terminal bar 34 of the present example includes a plurality of slits 40. The terminal bar 34 of the present example differs from the terminal bar 34 shown in FIG. 12 in that the terminal bar 34 of the present example includes the vibration absorbing member 42 in the slits 40. In the present example, the description focuses on points differing from those of the terminal bar 34 according to FIG. 12. The terminal bar 34 of the present example is an example of the current path portion 30 in which the inductance of the current path conducting through the conducting portion 10 is adjusted by the plurality of slits 40.

The vibration absorbing member 42 preferably includes an insulating material. The vibration absorbing member 42 includes a material with a lower heat transfer rate than the terminal bar 34. Therefore, even in a case where the vibration absorbing member 42 is provided in the slits 40, the inductances of the current paths in the terminal bar 34 can be adjusted in the same manner as with the slits 40 above. For example, the vibration absorbing member 42 includes a material having good compatibility with silicone gel filling the semiconductor device 100.

Furthermore, the vibration absorbing member 42 preferably includes a material that absorbs vibrations. For example, the terminal bar 34 is connected to the terminal using ultrasonic waves. If the terminal bar 34 includes a slit 40, there are cases where the shape of the terminal bar 34 changes or the vibration is amplified, due to ultrasonic vibration occurring when the terminal bar 34 is connected. By including the vibration absorbing member 42, the terminal bar 34 of the present example can reduce the effect of ultrasonic vibration.

As an example, the terminal bar 34 is electrically connected to one of the external connection terminals among the first external connection terminal tm1 to the fifth external connection terminal tm5 shown in FIG. 2. In this case, each current output portion D functions as one of the external connection terminals among the first external connection terminal tm1 to the fifth external connection terminal tm5. In the present example, the terminal bar 34 is used as the N terminal, and therefore the current output portion D functions as the fourth external connection terminal tm4 (N).

Figure 14:
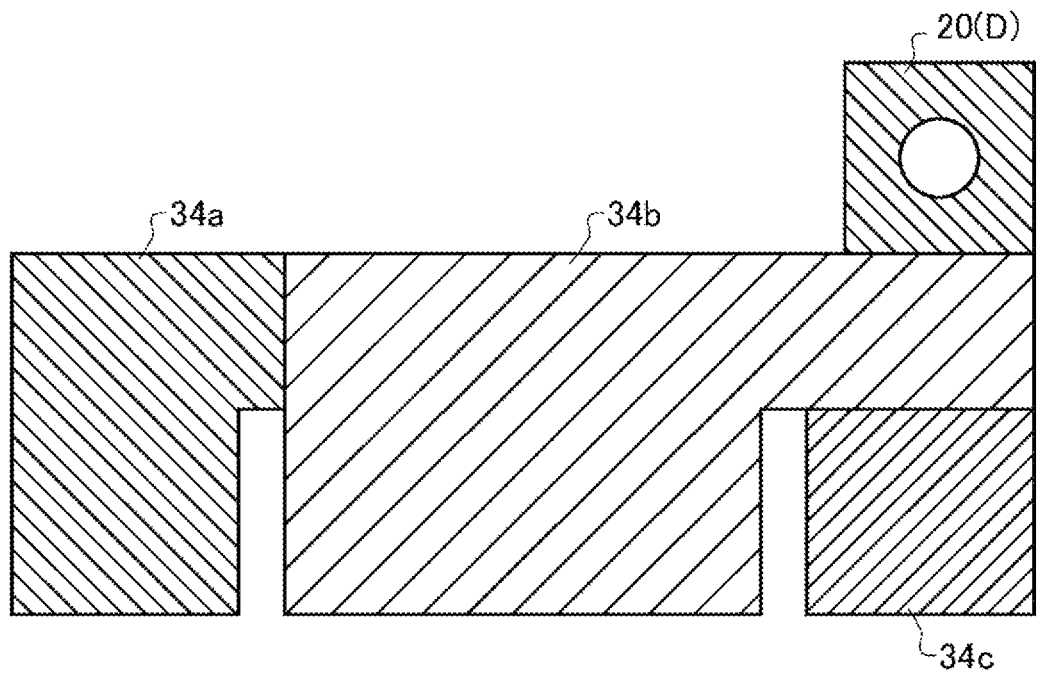
FIG. 14 shows an example of a configuration of the terminal bar 34 including different types of material.
Figure 14:
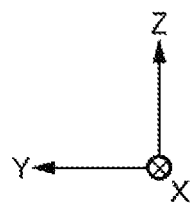

FIG. 14 shows an example of a configuration of the terminal bar 34 including different types of material. The terminal bar 34 of the present example adjusts the inductances of the current paths by including a plurality of different materials. In one example, the number of materials included in the terminal bar 34 corresponds to the number of conducting portions 10. The terminal bar 34 of the present example includes three different materials. The terminal bar 34 of the present example is an example of the current path portion 30 in which the inductances of the current paths in which current is conducted through the conducting portions 10 are adjusted by different materials.

The terminal bar 34 includes three terminal bars 34a to 34c that are electrically connected to three conducting portions 10. The distance to the current output portion D of the terminal bar 34a is greater than the distance to the current output portion D of the terminal bar 34b. Furthermore, the distance to the current output portion D of the terminal bar 34b is greater than the distance to the current output portion D of the terminal bar 34c.

The inductances of the terminal bars 34a to 34c are adjusted by forming these three terminal bars 34a to 34c with different materials. In one example, the terminal bar 34a is formed of a material with a lower inductance than the material of the terminal bar 34b. Furthermore, the terminal bar 34b may be formed of a material with a lower inductance than the material of the terminal bar 34c. In this way, it is possible to make the inductances of the terminal bars 34a to 34c equal. As an example, the material with a low inductance is a material with high electrical conductivity.

The material of the terminal bars 34 is a conductive material such as silver, a silver alloy, copper, a copper alloy, gold, a gold alloy, alumina, or an alumina alloy. The terminal bars 34 are preferably selected in consideration of the cost, strength, workability, and the like.

As described above, by providing the slits 40 in the current path portion 30 in the semiconductor device 100, the inductance is adjusted and the current imbalance is also adjusted. The semiconductor device 100 may adjust the inductances in circuits that are outside the semiconductor device 100 as well. For example, in a case where a semiconductor system is formed by a plurality of semiconductor devices 100, the plurality of semiconductor devices 100 are arranged such that the inductances of external circuits connecting the plurality of semiconductor devices 100 become constant.

Figure 15:
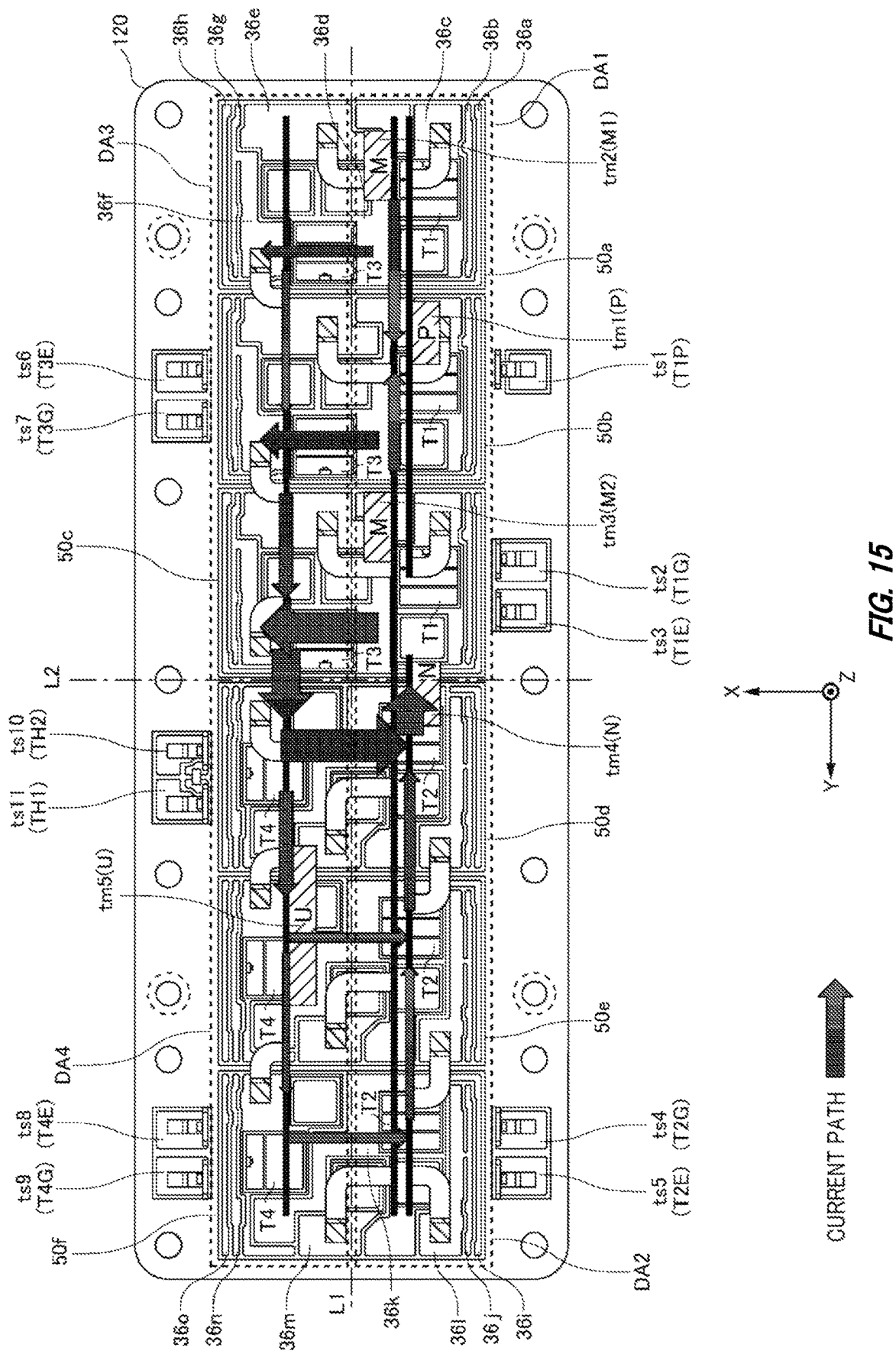
FIG. 15 is an example of a planar view of a semiconductor device 100 according to another example

FIG. 15 is an example of a planar view of a semiconductor device 100 according to another example. This drawing also shows an example of an arrangement of circuits provided on the base portion 120 inside the case portion 110. The semiconductor device 100 differs from the semiconductor device 100 of FIG. 2 in that this semiconductor device 100 forms an I-type three-level power conversion circuit, which is described further below. In the present example, the description focuses on points differing from those shown in FIG. 2.

In the I-type three-level power conversion circuit, the transistors T1 to T4 are connected in series. In the present example, the transistor T1, the transistor T3, the transistor T4, and the transistor T2 are connected in series in the stated order. The transistors T1 to T4 may each be formed by three parallel elements. The regions DA1 to DA4 may include three or more conducting portions 10 arranged along the Y-axis direction. For example, three of the transistors T1 are arranged along the Y-axis direction in the first region DA1. In the present example, the Y-axis direction is an example of a first direction, and the X-axis direction is an example of a second direction that is perpendicular to the first direction.

The region DA1 is provided farther on the negative Y-axis direction side than the region DA2. The region DA1 includes a current path. The region DA3 and the region DA4 are arranged along the Y-axis direction. The region DA3 is provided farther on the negative Y-axis direction side than the region DA4.

The region DA1 and the region DA3 are arranged along the X-axis direction. The region DA1 is provided farther on the negative X-axis direction side than the region DA3. The region DA3 includes a current path that is electrically connected to the region DA1.

The region DA2 and the region DA4 are arranged along the X-axis direction. The region DA2 is provided farther on the negative X-axis direction side than the region DA4. The region DA2 includes a current path. The region DA4 and the region DA3 are arranged along the Y-axis direction. The region DA4 includes a current path that is electrically connected to each of the current path of the region DA2 and the current path of the region DA3. Therefore, there are cases where a current path occurs in which the region DA1, the region DA3, the region DA4, and the region DA2 are connected in the stated order.

Here, in the semiconductor device 100, there are cases where a short-circuit current flows in a U shape or a C shape among the plurality of regions DA. For example, when a short occurs between the second external connection terminal tm2 (M1) and third external connection terminal tm3 (M2) and the fourth external connection terminal tm4 (N), the current flows in a U shape through the region DA1, the region DA3, the region DA4, and the region DA2, in the stated order.

The fourth external connection terminal tm4 (N) is provided in the region DA2. The fourth external connection terminal tm4 (N) is provided in the center of the semiconductor device 100 in the XY-plane. For example, the fourth external connection terminal tm4 (N) is provided on the negative Y-axis direction side of the center of the region DA2. Furthermore, the fourth external connection terminal tm4 (N) may be arranged straddling the region DA2 and the region DA1 in the XY plane. When the fourth external connection terminal tm4 (N) is provided at the center of the semiconductor device 100 in the XY-plane, there are cases where a difference occurs between current paths according to the distance from the center of circulation of the short-circuit current, as described further below.

The arrows shown in FIG. 15 indicate a current path of a short-circuit current from the second external connection terminal tm2 (M1) and third external connection terminal tm3 (M2) to the fourth external connection terminal tm4 (N). In this case, the short-circuit current flows from the second external connection terminal tm2 (M1) and third external connection terminal tm3 (M2), through the transistor T3, the transistor T4, and the transistor T2, and to the fourth external connection terminal tm4 (N). In other words, the short-circuit current flows in a U shape or a C shape through the regions DA1 to DA4.

When the current flows around an internal circuit in a U shape or C shape, the current path for the circuit portion arranged closer to the center of the circulation of the current tends to be shorter than the current path for the circuit portion arranged farther from the center of the circulation. When there is a difference between the current paths, a difference also occurs between the inductance in each current path. Therefore, a difference occurs in the short-circuit current peaks or di/dt, which should be the same in each phase, and this can be a cause of breakdown of the module.

Here, focusing on the region DA2, the fourth external connection terminal tm4 (N) is arranged near the center of the module. Therefore, the current path of the insulating substrate near the center of the module, which is near the fourth external connection terminal tm4 (N), is shorter than the current path farther outward from the center. By providing the slits 40, in the semiconductor device 100 of the present example, it is possible to increase the size of the current paths of circuit portions arranged near the circulation center, and therefore the overall balance of the lengths of the current paths can be improved.

One of the current input portion E and the current output portion D may be provided closer to the center of the semiconductor device 100 than to the center of a region including three or more conducting portions 10. For example, being close to the center of the semiconductor device 100 refers to being closer to an intersection point of the center line L1 and the center line L2 than the center of the region including the three or more conducting portions 10. One or more slits 40 may be provided to the current path portions 30 close to the center of the semiconductor device 100. For example, one or more slits 40 are provided to the current path portions 30 up to the current path portion 30 of the conducting portion 10 arranged closest to the region DA1, among the current path portions 30 in which currents are respectively conducted through the three or more conducting portions 10 provided in the region DA2. In this way, even if the one of the current input portion E and the current output portion D is provided close to the semiconductor device 100, the overall balance of the lengths of the current paths can be improved.

Figure 16:
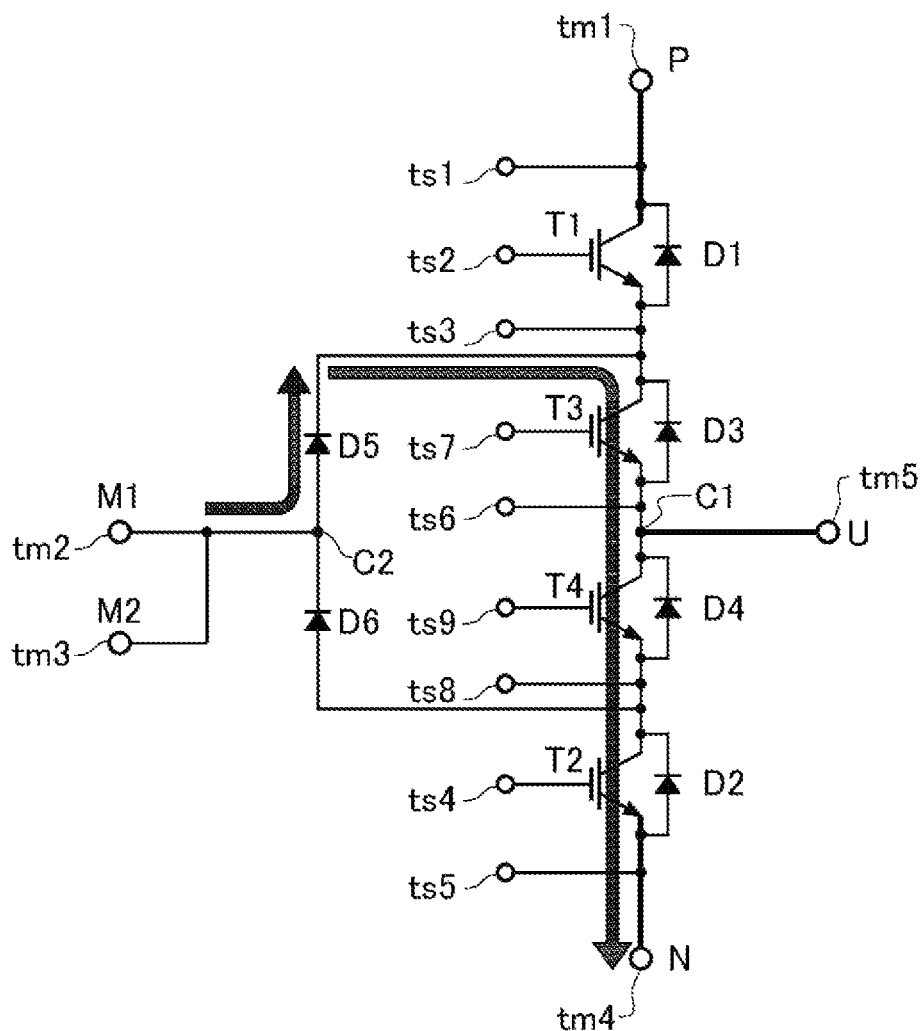
FIG. 16 shows an example of a circuit configuration of one phase of the three-level power conversion circuit (inverter).

FIG. 16 shows an example of a circuit configuration of one phase of the three-level power conversion circuit (inverter). The internal circuit of the present example is the circuit of one phase (U phase) among the three phases (U phase, V phase, and W phase) of the three-level power conversion circuit. The circuit configuration of the one phase is formed by the four transistors T1 to T4 and six diodes D1 to D6. The three or more conducting portions 10 may each include the four transistors T1 to T4 and the six diodes D1 to D6. The transistors T1 to T4 are insulated gate bipolar transistors.

The transistor T1, the transistor T3, the transistor T4, and the transistor T2 are connected in series in the stated order, between the first external connection terminal tm1 (P) and the fourth external connection terminal tm4 (N). A plurality of these transistors are connected in parallel in FIG. 15, but in the circuit of FIG. 16, one of each transistor is shown. For example, the plurality of transistors T1 are connected to each other in parallel, and the plurality of transistors T4 are connected to each other in parallel. Furthermore, the plurality of transistors T4 and the plurality of transistors T1 are respectively connected to each other in series. The transistors T1 to T4 are connected respectively in reverse-parallel to the diodes D1 to D4.

The connection point C1 is a connection point between the emitter terminal of the transistor T3 and the collector terminal of the transistor T4. The connection point C1 is connected to the fifth external connection terminal tm5 (U), which serves as the AC output terminal. The fifth external connection terminal tm5 (U) is an example of a U terminal.

The collector terminal of the transistor T3 and the emitter terminal of the transistor T4 are connected via the two diodes D5 and D6, which are provided in series. The diodes D5 and D6 are arranged such that the direction from the emitter terminal of the transistor T4 toward the collector terminal of the transistor T3 is the forward direction. The diodes D5 and D6 are omitted from the drawing of FIG. 15. The diodes D5 and D6 may be provided on the conductive pattern 36, may be provided in the region DA1 or the region DA2, or may be provided at another location.

The connection point C2 is a connection point between the two diodes D5 and D6. The connection point C2 is connected to the second external connection terminal tm2 (M1) and the third external connection terminal tm3 (M2). The second external connection terminal tm2 (M1) and the third external connection terminal tm3 (M2) are examples of M terminals. With such a configuration, the internal circuit operates as an I-type three-level power conversion circuit in which the four transistors T1 to T4 are connected in series.

Figure 17A:
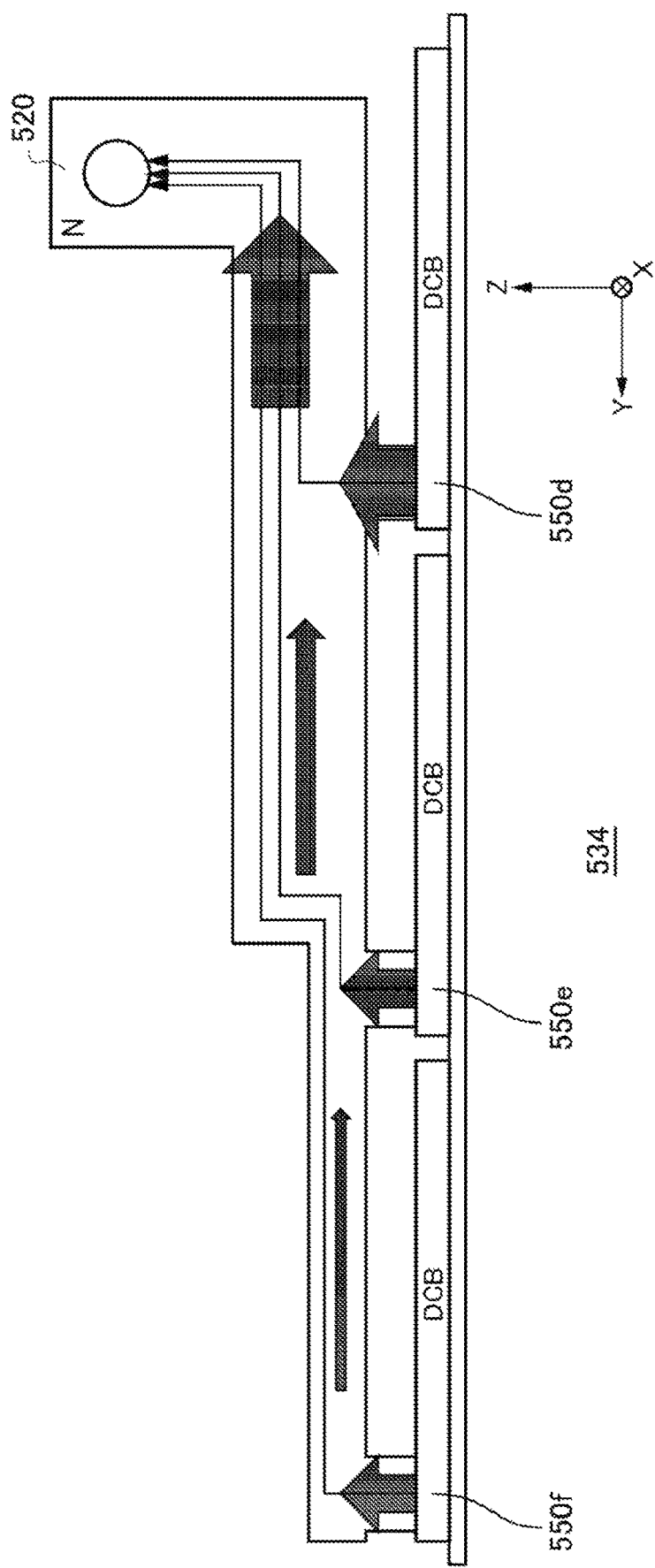
FIG. 17A shows an example of a configuration of a terminal bar 534 according to a comparative example

FIG. 17A shows an example of a configuration of a terminal bar 534 according to a comparative example. The terminal bar 534 does not include a slit 40. In the present example, three insulating substrates 550 are included, but the semiconductor device 500 is not limited to this. The current input/output portion 520 is connected to the fourth external connection terminal tm4 (N). The current flowing through the terminal bar 534 is input from the three insulating substrates 550 and is output from the current input/output portion 520 provided on the negative Y-axis direction side. Therefore, the length of the current path of the insulating substrate 550d, which is provided farthest on the negative Y-axis direction side, becomes shorter. In this way, when variation occurs among the lengths of the current paths, differences occur among the short-circuit current peaks, thereby possible causing a breakdown.

Figure 17B:
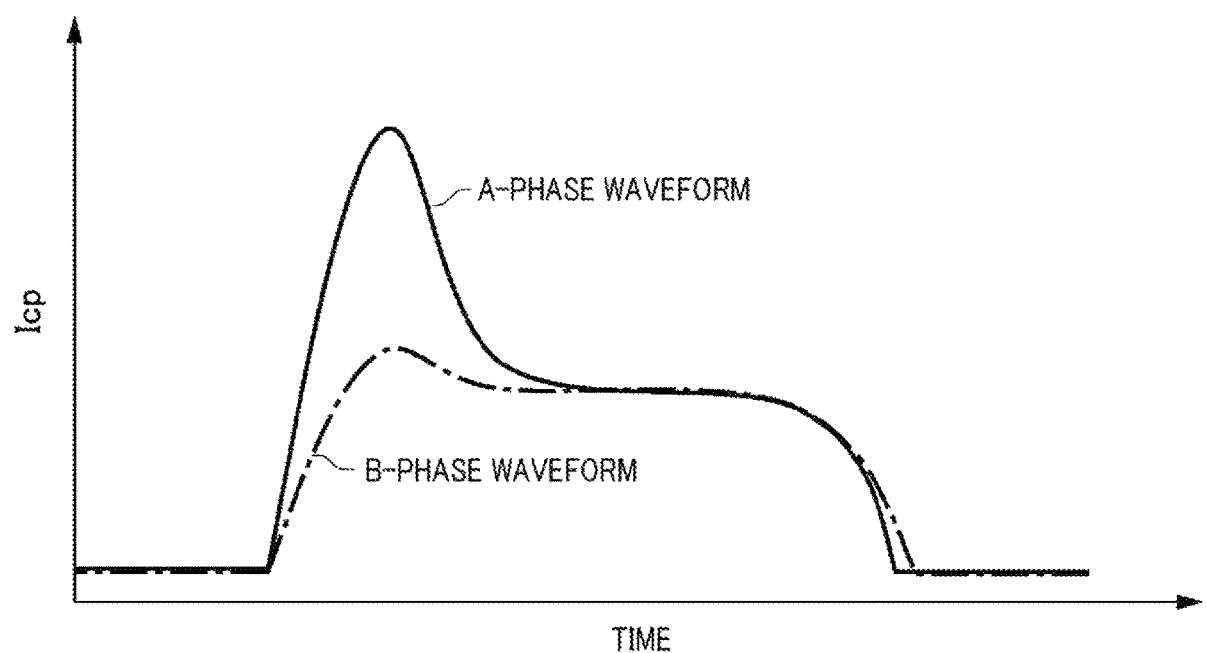
FIG. 17B shows an example of a waveform of the collector current Icp flowing through the semiconductor device 500 according to the comparative example.

FIG. 17B shows an example of a waveform of the collector current Icp flowing through the semiconductor device 500 according to the comparative example. The vertical axis indicates the collector current Icp flowing through the semiconductor device 500, and the horizontal axis indicates time. In the present example, the A-phase waveform of the semiconductor device 500 is indicated by a solid line, and the B-phase waveform is indicated by a single-dot chain line. The A-phase waveform is the waveform of the collector current flowing through a current path closer to the fourth external connection terminal tm4 (N) than the current path through which the current having the B-phase waveform flows. Therefore, the A-phase waveform indicates a larger collector current Icp than the B-phase waveform.

Figure 18A:
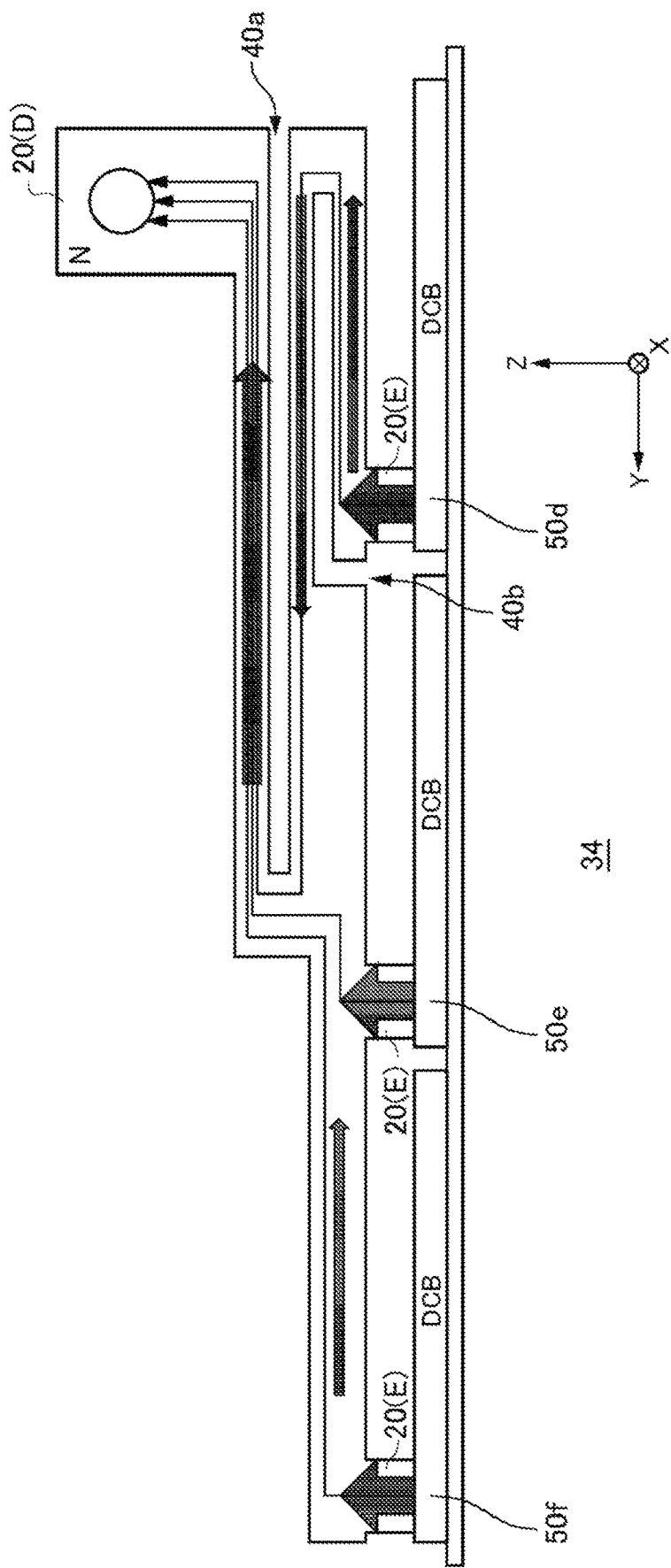
FIG. 18A shows an example of a configuration of a terminal bar 34 according to an example

FIG. 18A shows an example of a configuration of a terminal bar 34 according to an example. The terminal bar 34 includes slits 40. The terminal bar 34 of the present example includes slits 40 with shapes similar to those in the terminal bar 34 shown in FIG. 12. However, as long as the length of the current path for the current input from each current input/output portion 20 is adjusted, the shapes of the slits 40 are not limited to those of the present example.

In the present example, by providing the slits 40 to the terminal bar 34 connected to the N terminal, it is possible to ameliorate the current imbalance in consideration of the length of the current paths in the entire module. Therefore, inside the terminal bar 34, the length of each current path is may be different. For example, in the terminal bar 34, the current path for the current input from the insulating substrate 50d may be longer than the current paths for the currents input from the insulating substrate 50e and the insulating substrate 50f. Furthermore, in the terminal bar 34, the current path for the current input from the insulating substrate 50e may be longer than the current path for the current input from the insulating substrate 50f.

Figure 18B:
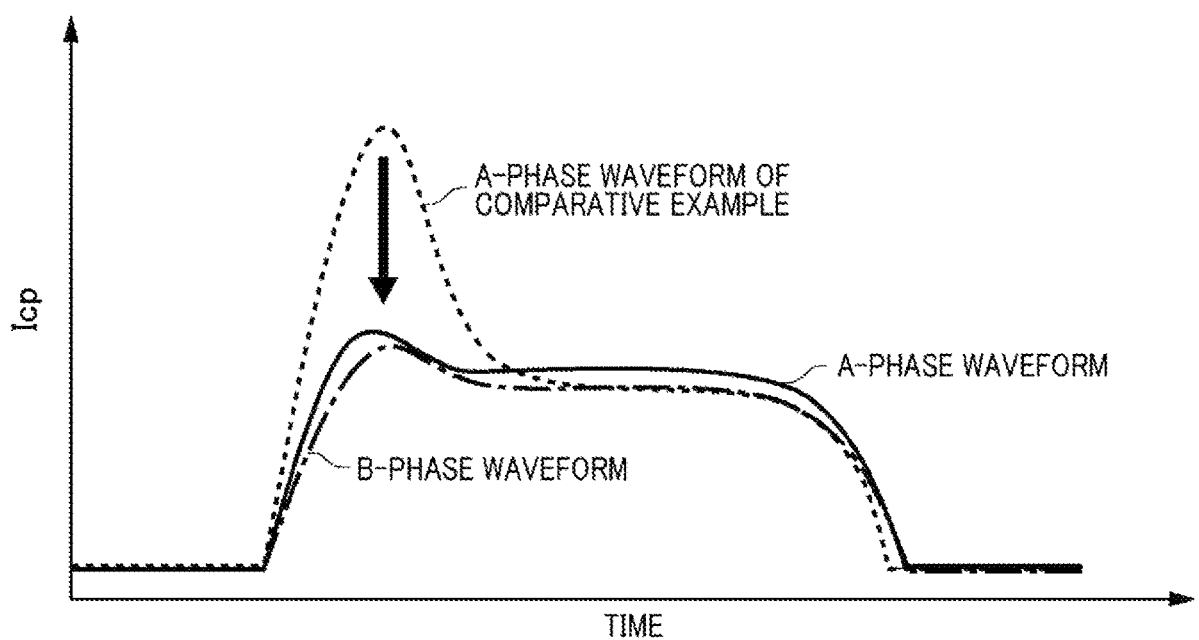
FIG. 18B shows an example of a waveform of the collector current Icp flowing through the semiconductor device 100 according to the example.

FIG. 18B shows an example of a waveform of the collector current Icp flowing through the semiconductor device 100 according to the example. The vertical axis indicates the collector current Icp flowing through the semiconductor device 100, and the horizontal axis indicates time. In the present example, the A-phase waveform of the semiconductor device 100 is indicated by a solid line, and the B-phase waveform is indicated by a single-dot chain line. Furthermore, the A-phase waveform of the semiconductor device 500 according to the comparative example is indicated by a dashed line. The A-phase waveform of the semiconductor device 100 is the waveform of the collector current flowing through a current path closer to the fourth external connection terminal tm4 (N) than the current path through which the current having the B-phase waveform flows. However, by providing the slits 40 to the terminal bar 34 in the semiconductor device 100, it is possible to reduce the difference between the A-phase waveform and the B-phase waveform.

By providing the slits 40 to the terminal bar 34, the semiconductor device 100 of the present example can ameliorate the current imbalance in consideration of the length of the current paths inside the terminal bar 34. Furthermore, by providing the slits 40 to the terminal bar 34 connected to the N terminal, the semiconductor device 100 can ameliorate the current imbalance in consideration of the length of the current paths in the entire module.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor chip;
   a first current input/output portion that is electrically connected to the semiconductor chip;
   a second current input/output portion that is electrically connected to the semiconductor chip;
   three or more conducting portions provided with the semiconductor chip, between the first current input/output portion and the second current input/output portion;
   a current path portion having a path through which current is conducted to each of the three or more conducting portions; and
   a lead frame that is electrically connected to the semiconductor chip, wherein
   the current path portion includes a plurality of slits,
   the conducting portions are the semiconductor chip, and
   the current path portion is the lead frame.

2. The semiconductor device according to claim 1, wherein
   the first current input/output portion is a current input portion,
   the second current input/output portion is a current output portion,
   the three or more conducting portions include a first conducting portion, a second conducting portion, and a third conducting portion that are arranged in order,
   the plurality of slits include a first slit and a second slit,
   an end portion of the first slit is provided between the current output portion and the first conducting portion, and
   an end portion of the second slit is provided between the first conducting portion and the second conducting portion.

3. The semiconductor device according to claim 1, wherein
   the three or more conducting portions include a first conducting portion, a second conducting portion, and a third conducting portion that are arranged in order,
   the plurality of slits include a first slit and a second slit,
   an end portion of the first slit is provided between the first conducting portion and the second conducting portion, and
   an end portion of the second slit is provided between the second conducting portion and the third conducting portion.

4. The semiconductor device according to claim 1, wherein the plurality of slits include an L-shaped slit and an F-shaped slit.

5. The semiconductor device according to claim 1, wherein
the plurality of slits include an L-shaped slit and an I-shaped slit.

6. The semiconductor device according to claim 1, wherein
the first current input/output portion is a current input portion,
the second current input/output portion is a current output portion, and
the plurality of slits are provided on the current input portion side of the conducting portions.

7. The semiconductor device according to claim 1, wherein
the first current input/output portion is a current input portion,
the second current input/output portion is a current output portion, and
the plurality of slits are provided on the current output portion side of the conducting portions.

8. The semiconductor device according to claim 1, wherein
the plurality of slits are formed in a pattern.

9. The semiconductor device according to claim 1, wherein
the semiconductor device comprises an insulating vibration absorbing member in the plurality of slits.

10. The semiconductor device according to claim 1, wherein
the three or more conducting portions each include:
a first transistor that has a collector terminal connected to a P terminal;
a second transistor that has an emitter terminal connected to an N terminal, and is connected in series with the first transistor; and
a third transistor and a fourth transistor forming a bidirectional switch,
a connection point between an emitter terminal of the first transistor and a collector terminal of the second transistor is connected to a U terminal, and
the bidirectional switch has one end connected to the connection point and the other end connected to an M terminal.

11. The semiconductor device according to claim 4, wherein
the three or more conducting portions each include:
a first transistor that has a collector terminal connected to a P terminal;
a second transistor that has an emitter terminal connected to an N terminal;
a third transistor that is connected in series with the first transistor;
a fourth transistor that is connected in series with the third transistor and the second transistor; and
two diodes that are provided in series between a collector terminal of the third transistor and an emitter terminal of the fourth transistor,
a connection point between an emitter terminal of the third transistor and a collector terminal of the fourth transistor is connected to a U terminal, and
a connection point between the two diodes is connected to an M terminal.

12. The semiconductor device according to claim 1, wherein
either the first current input/output portion or the second current input/output portion is provided to be closer to a center of the semiconductor device than a center of a region including the three or more conducting portions, and
the plurality of slits are provided to the current path portion near the center of the semiconductor device.

13. The semiconductor device according to claim 1, wherein
the semiconductor device comprises:
a first region that includes a current path;
a second region that is arranged along a first direction with the first region and includes the three or more conducting portions arranged along the first direction;
a third region that is arranged along a second direction, which is perpendicular to the first direction, with the first region and includes a current path electrically connected to the first region; and
a fourth region that is arranged along the second direction with the second region and along the first direction with the third region and includes a current path electrically connected to each of the second region and the third region, and
the plurality of slits are provided to the current path portion reaching the conducting portion arranged closest to the first region, among a plurality of current path portions, which are each the current path portion, electrically connected respectively to the three or more conducting portions provided in the second region.

14. The semiconductor device according to claim 4, wherein
at least one slit among the plurality of slits is provided extending from an end portion of the current path portion to inside the current path portion, and
the current path portion is a conductive pattern provided on an insulating substrate.

15. A semiconductor device comprising:
a semiconductor chip;
a first current input/output portion that is electrically connected to the semiconductor chip;
a second current input/output portion that is electrically connected to the semiconductor chip;
three or more conducting portions provided with the semiconductor chip, between the first current input/output portion and the second current input/output portion;
a current path portion having a path through which current is conducted to each of the three or more conducting portions;
an insulating substrate provided with the semiconductor chip; and
a terminal bar for electrically connecting the semiconductor chip and an external terminal, wherein
the current path portion includes a plurality of slits,
the conducting portions are the insulating substrate, and
the current path portion is the terminal bar.

16. The semiconductor device according to claim 15, wherein
the first current input/output portion is a current input portion,
the second current input/output portion is a current output portion,
the three or more conducting portions include a first conducting portion, a second conducting portion, and a third conducting portion that are arranged in order,
the plurality of slits include a first slit and a second slit, an end portion of the first slit is provided between the current output portion and the first conducting portion, and an end portion of the second slit is provided between the first conducting portion and the second conducting portion.

17. The semiconductor device according to claim 15, wherein
the three or more conducting portions include a first conducting portion, a second conducting portion, and a third conducting portion that are arranged in order,
the plurality of slits include a first slit and a second slit,
an end portion of the first slit is provided between the first conducting portion and the second conducting portion, and
an end portion of the second slit is provided between the second conducting portion and the third conducting portion.

18. The semiconductor device according to claim 15, wherein
the plurality of slits include an L-shaped slit and an F-shaped slit.

19. The semiconductor device according to claim 15, wherein
the plurality of slits include an L-shaped slit and an I-shaped slit.

20. The semiconductor device according to claim 15, wherein
the first current input/output portion is a current input portion,
the second current input/output portion is a current output portion, and
the plurality of slits are provided on the current input portion side of the conducting portions.

21. The semiconductor device according to claim 15, wherein
the first current input/output portion is a current input portion,
the second current input/output portion is a current output portion, and
the plurality of slits are provided on the current output portion side of the conducting portions.

22. The semiconductor device according to claim 15, wherein
the plurality of slits are formed in a pattern.

23. The semiconductor device according to claim 15, wherein
the semiconductor device comprises an insulating vibration absorbing member in the plurality of slits.

24. The semiconductor device according to claim 15, wherein
the three or more conducting portions each include:
a first transistor that has a collector terminal connected to a P terminal;
a second transistor that has an emitter terminal connected to an N terminal, and is connected in series with the first transistor; and
a third transistor and a fourth transistor forming a bidirectional switch,
a connection point between an emitter terminal of the first transistor and a collector terminal of the second transistor is connected to a U terminal, and
the bidirectional switch has one end connected to the connection point and the other end connected to an M terminal.

25. The semiconductor device according to claim 15, wherein
the three or more conducting portions each include:
a first transistor that has a collector terminal connected to a P terminal;
a second transistor that has an emitter terminal connected to an N terminal;
a third transistor that is connected in series with the first transistor;
a fourth transistor that is connected in series with the third transistor and the second transistor; and
two diodes that are provided in series between a collector terminal of the third transistor and an emitter terminal of the fourth transistor,
a connection point between an emitter terminal of the third transistor and a collector terminal of the fourth transistor is connected to a U terminal, and
a connection point between the two diodes is connected to an M terminal.

26. The semiconductor device according to claim 15, wherein
either the first current input/output portion or the second current input/output portion is provided to be closer to a center of the semiconductor device than a center of a region including the three or more conducting portions, and
the plurality of slits are provided to the current path portion near the center of the semiconductor device.

27. The semiconductor device according to claim 15, wherein
the semiconductor device comprises:
a first region that includes a current path;
a second region that is arranged along a first direction with the first region and includes the three or more conducting portions arranged along the first direction;
a third region that is arranged along a second direction, which is perpendicular to the first direction, with the first region and includes a current path electrically connected to the first region; and
a fourth region that is arranged along the second direction with the second region and along the first direction with the third region and includes a current path electrically connected to each of the second region and the third region, and
the plurality of slits are provided to the current path portion reaching the conducting portion arranged closest to the first region, among a plurality of current path portions, which are each the current path portion, electrically connected respectively to the three or more conducting portions provided in the second region.

28. The semiconductor device according to claim 15, wherein
at least one slit among the plurality of slits is provided extending from an end portion of the current path portion to inside the current path portion, and
the current path portion is a conductive pattern provided on an insulating substrate.

29. A semiconductor device comprising:
a semiconductor chip;
a first current input/output portion and a second current input/output portion electrically connected to the semiconductor chip;
a plurality of conducting portions that are provided with the semiconductor chip and provided between the first current input/output portion and the second current input/output portion; and a plurality of current path portions that include paths through which current is conducted to the plurality of conducting portions, wherein
the plurality of current path portions include a plurality of current paths of different materials.

* * * * *